United States Patent
Yoshikawa et al.

(10) Patent No.: US 6,317,697 B1
(45) Date of Patent: Nov. 13, 2001

(54) BATTERY LIFE DETERMINATION APPARATUS AND BATTERY LIFE DETERMINATION METHOD

(75) Inventors: Tetsuo Yoshikawa; Hiroshi Fujii; Shigemitsu Kiso, all of Kyoto (JP)

(73) Assignee: Omron Corporation, Kyoto (JP)

( * ) Notice: Subject to any disclaimer, the term of this patent is extended or adjusted under 35 U.S.C. 154(b) by 0 days.

(21) Appl. No.: 09/077,613

(22) PCT Filed: Nov. 29, 1995

(86) PCT No.: PCT/JP95/02424

§ 371 Date: May 29, 1998

§ 102(e) Date: May 29, 1998

(87) PCT Pub. No.: WO97/20225

PCT Pub. Date: Jun. 5, 1997

(51) Int. Cl.[7] .............................. G01R 31/36; G06F 19/00
(52) U.S. Cl. .............................................. 702/63; 320/149
(58) Field of Search .......................... 702/52, 88, 60–64, 702/117, 130, 133, 182, 183, 187, 189; 320/132, 149, 127, DIG. 21; 307/64, 426, 433; 324/427, 431; 340/636; 700/286, 291, 297

(56) References Cited

U.S. PATENT DOCUMENTS

| | | |
|---|---|---|
| 4,377,787 | 3/1983 | Kikuoka et al. .................... 324/431 |
| 4,675,538 | 6/1987 | Epstein ................................. 307/64 |
| 4,678,998 | 7/1987 | Muramatsu ......................... 324/427 |
| 4,743,831 * | 5/1988 | Young .................................. 320/127 |
| 4,888,716 * | 12/1989 | Ueno ..................................... 702/63 |
| 4,947,123 | 8/1990 | Minezawa .......................... 324/427 |
| 5,295,078 | 3/1994 | Stich et al. ......................... 700/297 |
| 5,684,404 * | 11/1997 | Millar ................................ 324/426 |

FOREIGN PATENT DOCUMENTS

| | | |
|---|---|---|
| 56-148075 | 11/1981 | (JP) . |
| 2-77668 | 3/1990 | (JP) . |
| 3-158781 | 7/1991 | (JP) . |
| 4-88801 | 3/1992 | (JP) . |
| 5-297082 | 11/1993 | (JP) . |
| 6-186310 | 7/1994 | (JP) . |
| 06242192 * | 9/1994 | (JP) . |
| 6-242192 | 9/1994 | (JP) . |
| 06281708 * | 10/1994 | (JP) . |
| 6-281708 | 10/1994 | (JP) . |

* cited by examiner

*Primary Examiner*—Marc S. Hoff
*Assistant Examiner*—Manuel L. Barbee
(74) *Attorney, Agent, or Firm*—Morrison & Foerster LLP

(57) ABSTRACT

An apparatus for determining life of a battery which supplies charged electricity to an electrical appliance is equipped with a storage part for storing relationship between standard total values of discharge voltage drop amounts since a start of discharge of the battery and standard life values, a discharge voltage drop amount totalizer part for totalizing the discharge voltage drop amounts since the start of discharge with the battery being discharged, and a life determination part for determining the life of the battery from a measured total value of totalized discharge voltage drop amounts and the standard total values of the storage means.

11 Claims, 27 Drawing Sheets

|  | 0 °C | 10 °C | 25 °C | 45 °C |
|---|---|---|---|---|
| 50 W | ... | ... | ... | ... |
| 125 W | ... | ... | 58000VS | ... |
| 250 W | ... | ... | ... | ... |
| 500 W | 9700VS | 10700VS | ... | ... |

FIG.7

| LIFE VALUE | TOTAL VALUE |
|---|---|
| 100% | ...... |
| ⋮ | |
| 0% | ...... |

| LIFE VALUE | DIFFERENCE TOTAL VALUE |
|---|---|
| 100% | |
| 90% | |
| 80% | |

500 W, 10 °C

| LIFE VALUE | DIFFERENCE TOTAL VALUE |
|---|---|
| 100% | |
| 90% | |
| 80% | |

⋮

500 W, 25 °C

| LIFE VALUE | DIFFERENCE TOTAL VALUE |
|---|---|
| 100% | |
| 90% | |
| 80% | |

INTERPOLATION FOR 100%

|       | 0 °C      | 10 °C     | 25 °C    | 45 °C |
|-------|-----------|-----------|----------|-------|
| 50 W  | •••       | •••       | •••      | •••   |
| 125 W | •••       | •••       | 5 DIGITS | •••   |
| 250 W | •••       | •••       | •••      | •••   |
| 500 W | 20 DIGITS | 15 DIGITS | •••      | •••   |

FIG.13

INTERPOLATION RESULTS AT 180 W, 20 °C

| LIFE VALUE | DIFFERENCE TOTAL VALUE |
|------------|------------------------|
| 100%       |                        |
| 90%        |                        |
| 80%        |                        |

| DROP VALUE | PROGRESSIVE POWER TOTAL VALUE |
|---|---|
|  | 200 WS |
|  | 300 WS |
|  | 350 WS |
|  |  |

500 W, 10 °C

| DROP AMOUNT | PROGRESSIVE POWER TOTAL VALUE |
|---|---|
|  | 250 WS |
|  | 380 WS |
|  |  |

⋮

500 W, 25 °C

| DROP AMOUNT | PROGRESSIVE POWER TOTAL VALUE |
|---|---|
|  | 1000 WS |
|  |  |

INTERPOLATION RULES FOR 1 DIGIT

|       | 0 °C   | 10 °C  | 25 °C   | 45 °C |
|-------|--------|--------|---------|-------|
| 50 W  | •••    | •••    | •••     | •••   |
| 125 W | •••    | •••    | 1000 WS | •••   |
| 250 W | •••    | •••    | •••     | •••   |
| 500 W | 200 WS | 250 WS | •••     | •••   |

FIG.20

INTERPOLATION RESULTS AT 180 W, 20 °C

| DROP AMOUNT | DIFFERENCE TOTAL VALUE |
|-------------|------------------------|
|             | 600 WS                 |
|             |                        |
|             |                        |

FIG.21

|  | J | CORRECTION F | NUMERICAL VALUE H |
|---|---|---|---|
| I | | | |
| I−1 | | | |
| I−2 | | | |

FIG.22

CHARGE HISTORY LOW(0)

| LIFE VALUE | NEW(12) | MED(36) | OLD(60) |
|---|---|---|---|
| 100% | NORMAL | NORMAL | NORMAL |
| 70% | NORMAL | NORMAL | WARNING |
| 30% | WARNING | WARNING | ALARM |

CHARGE HISTORY MID(120)

| LIFE VALUE | NEW(12) | MED(36) | OLD(60) |
|---|---|---|---|
| 100% | NORMAL | NORMAL | NORMAL |
| 70% | NORMAL | WARNING | WARNING |
| 30% | WARNING | WARNING | ALARM |

CHARGE HISTORY HIG(240)

| LIFE VALUE | NEW(12) | MED(36) | OLD(60) |
|---|---|---|---|
| 100% | NORMAL | NORMAL | NORMAL |
| 70% | WARNING | ALARM | WARNING |
| 30% | WARNING | WARNING | ALARM |

FIG.27

BATTERY LIFE DETERMINATION APPARATUS AND BATTERY LIFE DETERMINATION METHOD

TECHNICAL FIELD

The present invention relates to an apparatus for determining a life of a battery, as well as a method therefor, which are attached to or contained in an electrical appliance to supply electricity to the electrical appliance in the event of a power failure.

BACKGROUND ART

Desirably, data processed by personal computers or workstations are stored even at a power failure of commercial power supply which supplies electricity to those equipments. Therefore, dischargeable and rechargeable batteries for backup use have been provided in order to allow the data prepared by personal computers or the like to be stored even in the event of a power failure.

However, the backup batteries deteriorate with time elapses, and the progress of deterioration would result in lowered reliability. For example, the life of lead-acid batteries which are ordinarily used for backup is said to be 2 to 3 years. Therefore, whereas a considerably deteriorated battery needs to be replaced with a new one, it would be too late to warn the user of replacement after the battery has completely deteriorated and it is important to give on advance notice of the time when the replacement would be required by notifying the user of the progress of deterioration. Under these circumstances, there have been provided apparatuses for determining the life of batteries by referencing the environmental temperature and the load capacity of the electrical appliance in a state that the electrical appliance is connected to a commercial power supply.

However, the environmental temperature and the load capacity are factors which significantly affect the life of the battery and its life determination. For this reason, when the load of the electrical appliance has changed or a temperature difference between inside and outside of the battery has occurred due to an abrupt change of the environmental temperature during the determination of the battery life, it would be the case not only that the correct life cannot be determined but also that such irrational results occur as a considerable deterioration despite being a new battery or, conversely, a remaining life similar to that of a new one despite having been used for several years.

Also, whereas discharge characteristic of individual batteries is not necessarily equal to one another, the conventional battery life determination method is based on an assumption that all the batteries have the same discharge characteristic, so that the method could not accurately determine the life when individual batteries have variations in discharge characteristic.

Further, because lead-acid batteries would abruptly deteriorate in dischargeability after about two-year use, the life of a battery that has been used for about two years could not accurately be determined only by periodically determining the life, for example, every month.

Furthermore, when lead-acid batteries are connected in series to one another, there may be a phenomenon, "cell failure", that one cell, i.e., the battery abruptly deteriorates with its discharge voltage abruptly dropped. Meanwhile, in the method in which the battery is discharged and the battery life is determined from the resulting discharge characteristics, as shown in FIG. 29(a), the discharge process is ended at a time point when the discharge voltage has reached a certain voltage value (discharge limit). The reason of this is that discharging the battery beyond the discharge limit would result in a considerably shortened battery life. However, there has been a problem that the terminal voltage would earlier reach a fixed discharge termination voltage, as shown in FIG. 29(b), thus suppressing a full exertion of the ability of the other cells that are free from cell failure.

Also, in the monitoring of the battery connection state in the prior art, the voltage of a battery for monitoring use is given to the voltage-dividing resistor to obtain a voltage for analog-to-digital conversion so that a relatively higher current would be passed, and moreover the battery voltage for backup is used. Therefore, the battery operates also in the off state of AC power supply (commercial power supply), i.e., during a power failure, so that a large power consumption is involved, and that various types of information could not be stored for long time.

SUMMARY OF THE INVENTION

Objects of the present invention are:

(a) to provide apparatus and method for accurately determining the life of a battery even with an abrupt change of load or environmental temperature;

(b) to provide apparatus and method for accurately determining the life of batteries even if the individual batteries have variations in discharge characteristic;

(c) to provide battery life determination apparatus and method which never elicit any irrational determination results;

(d) to provide apparatus and method for determining the life of a battery accurately anytime during the period of service life;

(e) to provide battery apparatus and method which, even with occurrence of any cell failure during the life determination, allowing the other cells to fully exert their abilities; and (f) to provide an uninterruptible power supply which allows the presence or absence of battery connection with low power consumption even while the AC power supply is turned off.

In order to achieve the above objects, according to the present invention, there is provided an apparatus for determining life of a battery which supplies charged electricity to an electrical appliance, comprising: life storing means for storing relationship between standard total values of discharge voltage drop amounts since a start of discharge of the battery and standard life values; discharge voltage drop amount totalizing means for totalizing the discharge voltage drop amounts since the start of discharge with the battery being discharged; and life determination means for determining the life of the battery from a measured total value of totalized discharge voltage drop amounts and the standard total values of the storage means.

This life transporting apparatus totalizes the amounts of discharge voltage drops from when the discharge starts to when a specified time elapses, and performs the life determination based on the resulting total value. Therefore, the determination result is less likely to vary due to load variations.

This battery life determination apparatus may further comprise: life storing means for storing relationship between standard total values of discharge voltage drop amounts since a start of discharge of the battery and standard life values; discharge voltage drop amount totalizing means for totalizing the discharge voltage drop amounts since the start of discharge with the battery being discharged; and life determination means for determining the life of the battery from a measured total value of totalized discharge voltage drop amounts and the standard total values of the storage means. This apparatus performs a plurality of times of initial discharge, calculates a correction factor, corrects the relationship between standard discharge voltage drop amount total values and standard life values by using the resulting correction factor, and determines the life by applying a measured discharge voltage drop amount total value to the corrected relationship. Therefore, even if the battery has characteristic variations, the apparatus can determine its life.

Also, the battery life determination apparatus may further comprise: life storing means for storing relationship between standard total values of discharge voltage drop amounts since a start of discharge of the battery and standard life values; discharge voltage drop amount totalizing means for totalizing the discharge voltage drop amounts since the start of discharge with the battery being discharged; and life determination means for determining the life of the battery from a measured total value of totalized discharge voltage drop amounts and the standard total values of the storage means. With this apparatus, the life determination is done in a state that surface and inside of the battery are of the same temperature. Therefore, the apparatus can determine the battery life accurately without being affected by temperature variations.

Further, the battery life determination apparatus may further comprise: life storing means for storing relationship between standard total values of discharge voltage drop amounts since a start of discharge of the battery and standard life values; discharge voltage drop amount totalizing means for totalizing the discharge voltage drop amounts since the start of discharge with the battery being discharged; and life determination means for determining the life of the battery from a measured total value of totalized discharge voltage drop amounts and the standard total values of the storage means. With this apparatus, an accurate life determination can be achieved even for batteries that have considerably deteriorated.

The battery life determination apparatus further may further comprise: life storing means for storing relationship between standard total values of discharge voltage drop amounts since a start of discharge of the battery and standard life values; discharge voltage drop amount totalizing means for totalizing the discharge voltage drop amounts since the start of the compulsory discharge of the charged battery; and life determination means for determining the life of the battery from a measured total value of totalized discharge voltage drop amounts and the standard total values of the storage means, where upon detection of a cell failure, the life determination can be done with a measured discharge voltage drop amount after correction.

Furthermore, an apparatus for determining life of a battery which supplies charged electricity to an electrical appliance may comprise: life storing means for storing relationship between standard total values of discharge voltage drop amounts since a start of discharge of the battery and standard life values; discharge voltage drop amount totalizing means for totalizing the discharge voltage drop amounts since the start of discharge with the battery being discharged; and life determination means for determining the life of the battery from a measured total value of totalized discharge voltage drop amounts and the standard total values of the storage means. This apparatus is free from occurrence of such irrational results as only a slight life of a battery that has just started being used.

According to the present invention, there is provided a method for determining life of a battery, comprising steps of: storing, in storage means, relationship between standard total values of discharge voltage drop amounts since a start of discharge of the battery and standard life values; measuring discharge voltage drop amounts with time elapse since the start of discharge with the battery being discharged; and determining the life of the battery from a measured total value of discharge voltage drop amounts during a specified time elapse and the relationship between standard total values and standard life values stored in the storage means.

This battery life determination method may further comprise steps of: executing a plurality of times of initial discharge of the battery; calculating a correction factor from discharge characteristics obtained from the plurality of times of initial discharge, as well as standard discharge characteristics; correcting the relationship between standard total values and standard life values stored in the storage means by using the correction factor; and determining the life of the battery by applying the measured total value to the corrected relationship.

Also, preferably, temperature is detected at a start of life determination, where if a temperature change of more than a specified value has occurred, the life determination is executed after a specified time elapse.

Further, it is also possible that the life determination is executed in steps of a first cycle until a specified time period elapses since a start of use of the battery, and the life determination is executed in steps of a second cycle shorter than the first cycle after the specified time period has elapsed.

According to the present invention, there is provided an electrical appliance which is equipped with a lead-acid battery and which is supplied with a power supply voltage from this lead-acid battery to its circuitry, the electrical appliance comprising: discharge characteristic measuring means for measuring discharge characteristic of the battery; cell failure deciding means for deciding presence or absence of a cell failure from the discharge characteristic; and means for lowering a discharge termination voltage of the battery by a specified value when presence of a cell failure is decided. In this equipment, upon detection of a cell failure, the discharge termination voltage is set to a specified lower value. Therefore, the discharge time is prolonged correspondingly, so that the life of the other cells free from any cell failure can be utilized effectively.

According to the present invention, there is provided an uninterruptible power supply equipped with a circuit section and a battery section, these circuit section and battery section being electrically connected to each other, the uninterruptible power supply comprising: ON-OFF deciding means for deciding ON or OFF of AC power supply for supplying power to the circuit section; first signal output means for outputting a voltage corresponding to a number of battery sections; second signal output means for outputting a binary signal corresponding to presence or absence of any connection of the battery sections; and monitoring means for monitoring the connection state of the battery sections based on a signal derived from the first signal output means for an ON state decided by the ON-OFF deciding means and on a signal derived from the second signal output means for an OFF state by the ON-OFF deciding means. Preferably, this uninterruptible power supply monitors the connection state of the battery section by converting a signal output of the former monitoring into a signal output of the latter monitoring out of an output of the first signal output means and the second signal output means, and by using an output signal after a process of running average. Preferably, a former signal output out of an output of the first signal output means and an output of the second signal output means, whichever it has been first monitored, is converted into a latter signal output upon a switch from ON state to OFF state or from OFF state to ON state, and the connection state of the battery sections is monitored by using the shift averaged latter signal output.

In this uninterruptible power supply, while the AC power supply is OFF, the circuit section operates on a voltage derived from the AC power supply, and outputs a voltage from the first signal output means in response to the number of batteries upon the discrimination of the ON state. Therefore, the monitoring means is enabled to know the number of connections by finely discriminating the resulting voltage. With the AC power supply OFF, on the other hand, since the second signal output means outputs a signal showing the presence or absence of connections of batteries, for example, a signal of either High or Low, the monitoring means is enabled to detect the presence or absence by discriminating the High or Low and further store it. In this case, all that is required is only to do the discrimination of High or Low, the power consumption can be reduced without the need of passing any large current to the voltage-dividing resistor.

BRIEF DESCRIPTION OF THE DRAWINGS

FIG. 7 shows a discharge voltage drop amount total value table;

FIG. 8 shows a life value table;

FIG. 12 is a view for describing a battery life determination table for load and temperatures;

FIG. 13 is a view showing an interpolation table for the 100% life value;

FIG. 14 is a view showing interpolation results for 180 W and 20° C.;

FIG. 19 is a view for describing standard voltage drop amount tables;

FIG. 20 is a view for describing an interpolation table of 1 digit for standard voltage drop amount and total value;

FIG. 21 is a view showing an example of interpolation results at 180 W, 20° C.;

FIG. 22 is a view for describing an array storage to be used for detection of a cell failure;

FIG. 27 is a view showing rules used by the fuzzy inference section;

DETAILED DESCRIPTION OF THE PREFERRED EMBODIMENTS

Preferred embodiments of the present invention will now be described with reference to the accompanying drawings.

(1) Constitution of Uninterruptible Power Supply

Figure 1:
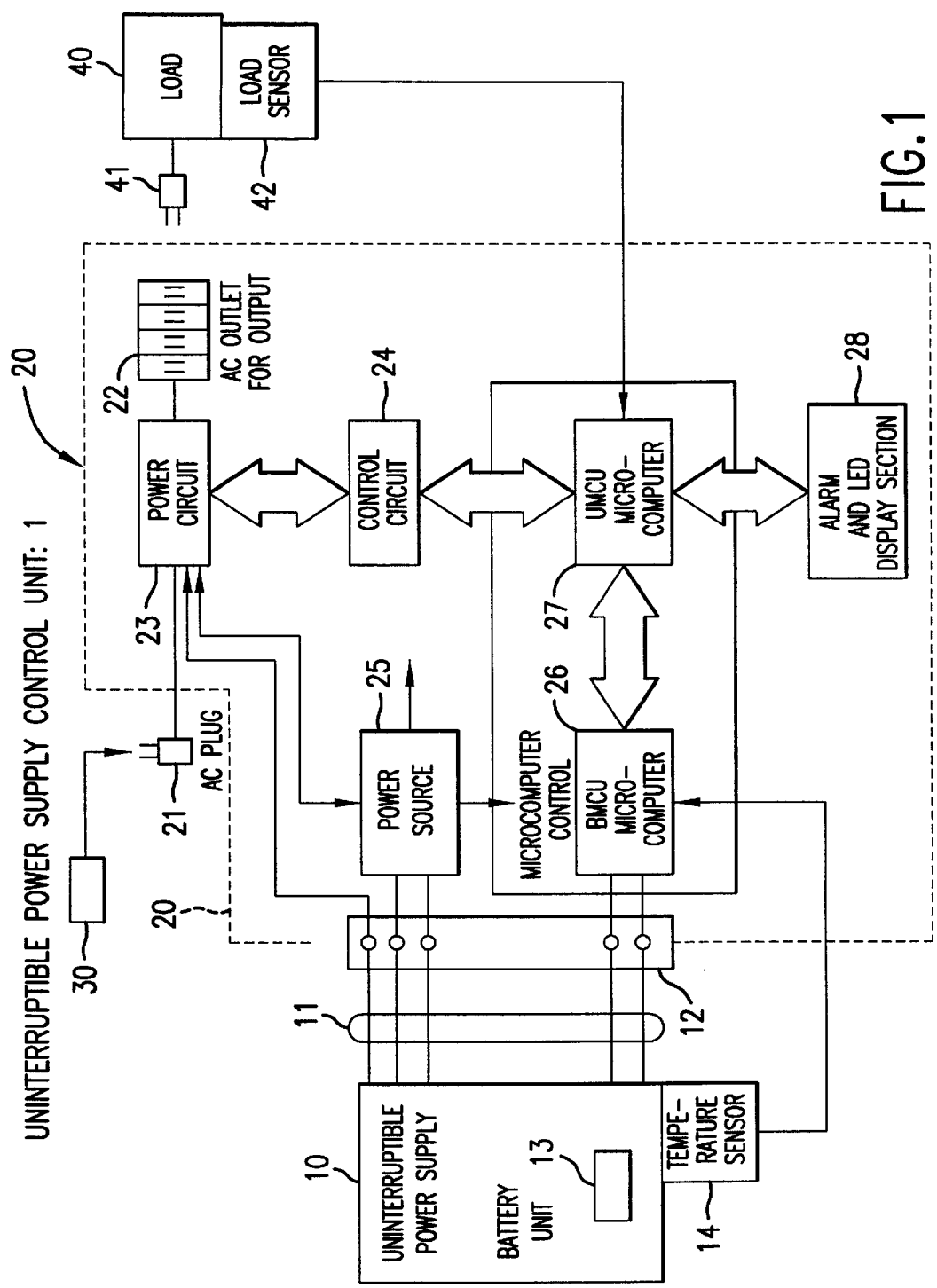
FIG. 1 is a block diagram of an uninterruptible power supply equipped with a battery life determination apparatus according to the present invention.

FIG. 1 is a block diagram of an uninterruptible power supply. The uninterruptible power supply, which is denoted as a whole by reference numeral 1, generally comprises a battery unit 10 and a control unit 20, where these battery unit 10 and control unit 20 are electrically connected to each other with a plurality of cables 11 and connectors 12. This uninterruptible power supply 1 supplies electricity fed ordinarily from commercial power supply 30, to an electrical appliance or electronic appliance 40, which is a load, via the control unit 20. Besides, the uninterruptible power supply 1 charges electricity to the battery unit 10, and upon an interruption of supply of power by the commercial power supply (for example, at a power failure), supplies electricity charged to the battery unit 10 to the load 40 via the control unit 20.

The battery unit 10 is equipped with a dischargeable/rechargeable battery 13 (generally implemented by a lead-acid battery) removably fitted thereto, and the life of this battery 13 is detected by battery life determination apparatus and method as will be described later. The battery unit 10 is also equipped with a converter circuit for converting the charged electricity of the battery 13 into an AC current, i.e., an inverter circuit (not shown).

The control unit 20 comprises a plug 21 connected to the commercial power supply 30, an outlet (receptacle) 22 to which the electrical appliance 40 is connected, a power circuit 23 provided between these plug 21 and outlet 22, and a control circuit 24 for controlling the power circuit 23. The control circuit 24 also monitors an AC voltage delivered from the commercial power supply 30 to the power circuit 23, where, for example, upon detection of an interruption of supply of power from the commercial power supply 30 due to a power failure, the control circuit 24 switches over the power circuit 23 to supply electric power from the battery 13 of the battery unit 10 to the electrical appliance 40 via the power circuit 23. A power source section 25 connected between the power circuit 23 and the battery unit 10 is equipped with a rectifier circuit and a voltage/current stabilizing circuit (not shown), where an AC current fed from the commercial power supply 30 via the power circuit 23 is transformed into a DC current by the rectifier circuit and the resulting DC current is stabilized and supplied to the battery unit 10, thus being charged to the battery 13. The power source section 25 is also equipped with a rechargeable battery (not shown), which supplies electricity to a BMCU microcomputer 26, a UMCU microcomputer 27, the control circuit 24 and the like within the control unit.

The BMCU microcomputer 26 is connected directly to the battery unit 10 via the cables 11 and the connectors 12. Also, the BMCU microcomputer 26 comprises an A/D (Analog-to-Digital) converter for converting an analog signal derived from the battery 13 into a digital signal, and backup cells for retaining converted data or the like, and performs the decision as to whether the battery unit 10 is connected to the control unit 20, and the later-described determination of life of the battery 13 as well as processes for this life determination. The UMCU microcomputer 27 is connected to the BMCU microcomputer 26, and outputs a signal to the control circuit 24 so as to switch the power circuit 23 according to an instruction from the BMCU microcomputer 26. Further, the UMCU microcomputer 27 is connected to a display 28 having alarm and display functions, so that the life of the battery 13 determined by the UMCU microcomputer 27, i.e., the battery's degree of deterioration, a battery replacement alarm or the like, is displayed on the display 28.

Also, a temperature sensor 14 is attached to the battery unit 10 so that environmental temperature under which the battery 13 is placed is inputted to the BMCU microcomputer 26. Further, the load, i.e. electrical appliance 40, is equipped with a load sensor 42 (e.g., current transformer) for detecting the load, where an output of the sensor is converted into a digital signal by the UMCU microcomputer 27 and the resulting digital signal is transmitted to the BMCU microcomputer 26 by serial communication.

(2) Operation of Uninterruptible Power Supply

Operation of the uninterruptible power supply 1 is outlined below. Normally, by a signal from the control circuit 243, the power circuit 23 is set to a state that it connects the plug 21 and the outlet 22 to each other. As a result, the electricity supplied form the commercial power supply 30 is supplied to the electrical appliance 40 via the plug 21, the power circuit 23, the outlet 22 and a plug 41 connected to the outlet 22. Also, the AC current supplied to the power circuit 23 is further supplied to the battery unit 10 via the power source section 25, by which the battery 13 is charged. Besides, the electricity supplied to the power source section 25 is partly charged to a built-in battery so as to be used as control currents for the microcomputer 26, 27 and various circuits.

Upon an interruption of supply of power from the commercial power supply 30 due to a power failure or the like, the resulting interrupted state is detected by the control circuit 24. The BMCU microcomputer 26 outputs a specified signal to the control circuit 24 via the UMCU microcomputer 27, so that the power circuit 23 is switched over. Also, according to a signal from the control circuit 24, the BMCU microcomputer 26 activates the battery 13 as well as an inverter circuit within the battery unit 10, so that the DC current outputted from the battery 13 is converted into an AC current and supplied to the electrical appliance 40 via the power circuit 23. As a result, the electrical appliance 40 operates in the same manner as in the normal state. In addition, even in this interrupted state, the BMCU microcomputer 26 monitors the connection state of the battery 13, its output voltage, time duration of use and the like.

(3) Battery Life Circuit

Figure 2:
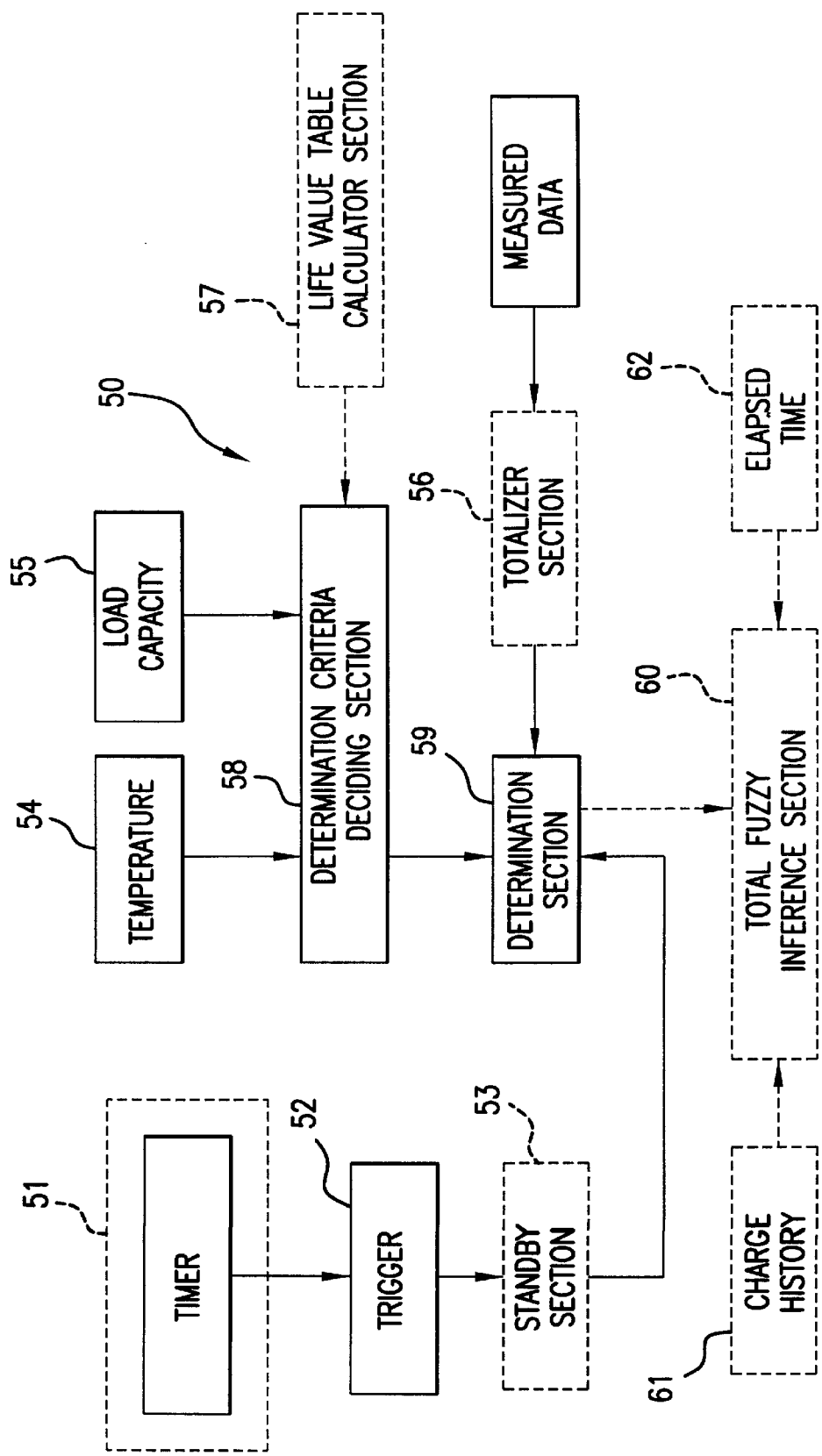
FIG. 2 is a block diagram showing the overall function of the uninterruptible power supply.

FIG. 2 shows a life determination circuit 50 of the BMCU microcomputer 26, where the life determination of the battery 13 is executed. This life determination is carried out, in principle, through the steps of determining the discharge voltage drop amount characteristic (actual discharge voltage drop amount characteristic) of the battery 13 by discharging the electricity charged in the battery 13 three times (initial discharge), and comparing the result with standard discharge voltage drop amount characteristics stored in the BMCU microcomputer 26. Further, the determined life value is re-determined by taking into consideration the charge history, elapsed time required for charging, etc. of the battery 13, and a notice of battery replacement or the like is issued based on the determination result.

Hereinbelow, individual sections of the life determination circuit 50 are described.

① Timer Section 51

Figure 3:
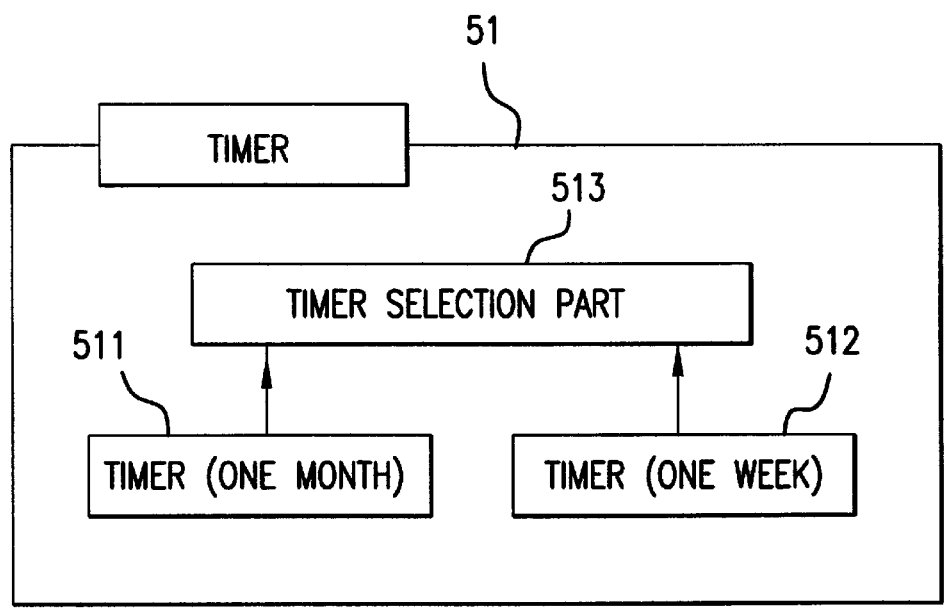
FIG. 3 is a block diagram showing the constitution of the timer section in the block diagram of FIG. 2.

In this life determination circuit 50, the timer section 51 designates the periodic cycle of life determination, and the life determination process is iterated in steps of the designated cycle. More specifically, the timer section 51, as shown in FIG. 3, comprises a one-month timer 511 which outputs a signal every one month, a one-week timer 512 which outputs a signal every one week, and a timer selection part 513 which selects either one of the timer 511 or the timer 512. This timer selection part 51 selects the one-month timer 511 for two years since the start of use of the battery 13, selects the one-week timer 512 after the elapse of two years since the start of use, and when the timer 511 or 512 has expired, the timer section 51 outputs a signal. The outputted signal is inputted to a trigger section 52, where a trigger signal is prepared. The trigger signal is outputted to a standby section 53.

② Standby Section 53

Figure 4:
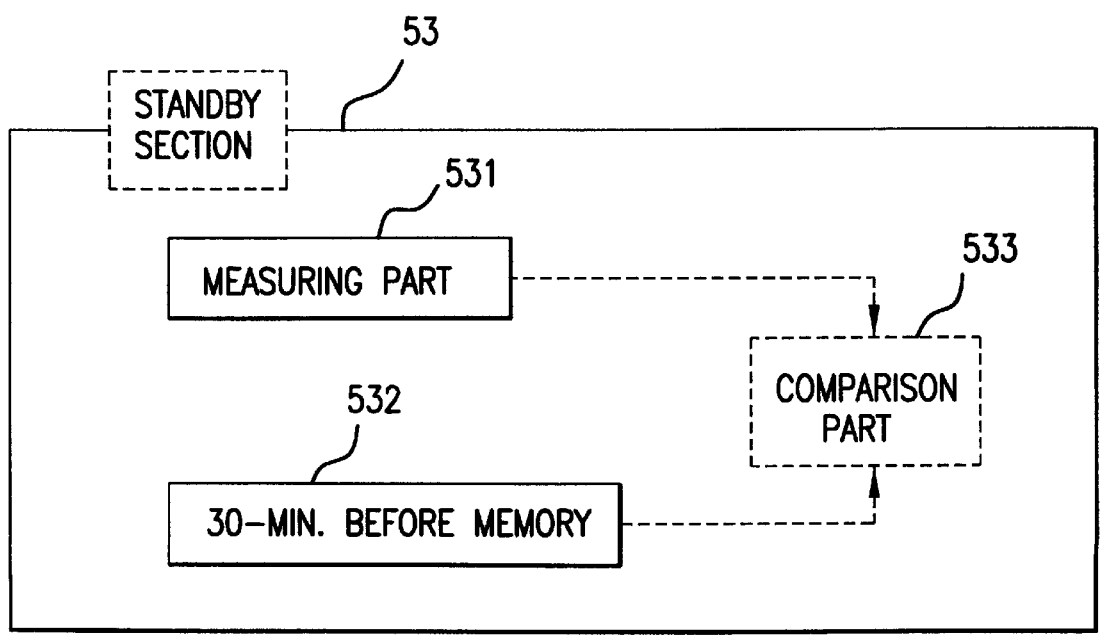
FIG. 4 is a block diagram showing the constitution of the standby section in the block diagram of FIG. 2.

The standby section 53 monitors variations in environmental temperature. When the temperature has abruptly changed, a standby state is kept for a specified time, thus eliminating any effects of such an abrupt change in circumstances on the life determination. More specifically, in the standby section 53, as shown in FIG. 4, a measuring part 531 measures the temperature based on the output from the temperature sensor 14. This temperature is compared in a comparison part 533 with the temperature of the preceding-time measurement effected, for example, 30 minutes before and stored in a memory 532. Then, if the newly measured temperature is higher than the temperature of the preceding-time measurement by a specified temperature (e.g., 4° C.) or more, then the life determination is permitted after a specified time.

③ Temperature Measuring Section 54

The temperature measuring section 54 detects temperature based on an output from the temperature sensor 14. In this case, if the environmental temperature under which the battery unit 10 is placed is within a specified temperature range of, for example, 0 to 40° C., then the processing of life determination is permitted; if it is outside the range, the life determination is inhibited.

④ Load Capacity Measuring Section 55

The load capacity measuring section 55 detects the load of the electrical appliance 40 based on an output from the load sensor 42. Then, if the load capacity is below the rated power of the uninterruptible power supply 1 and moreover equal to or more than, e.g., 15% of the rated power, the life determination is permitted; otherwise, the life determination is inhibited.

Figure 5:
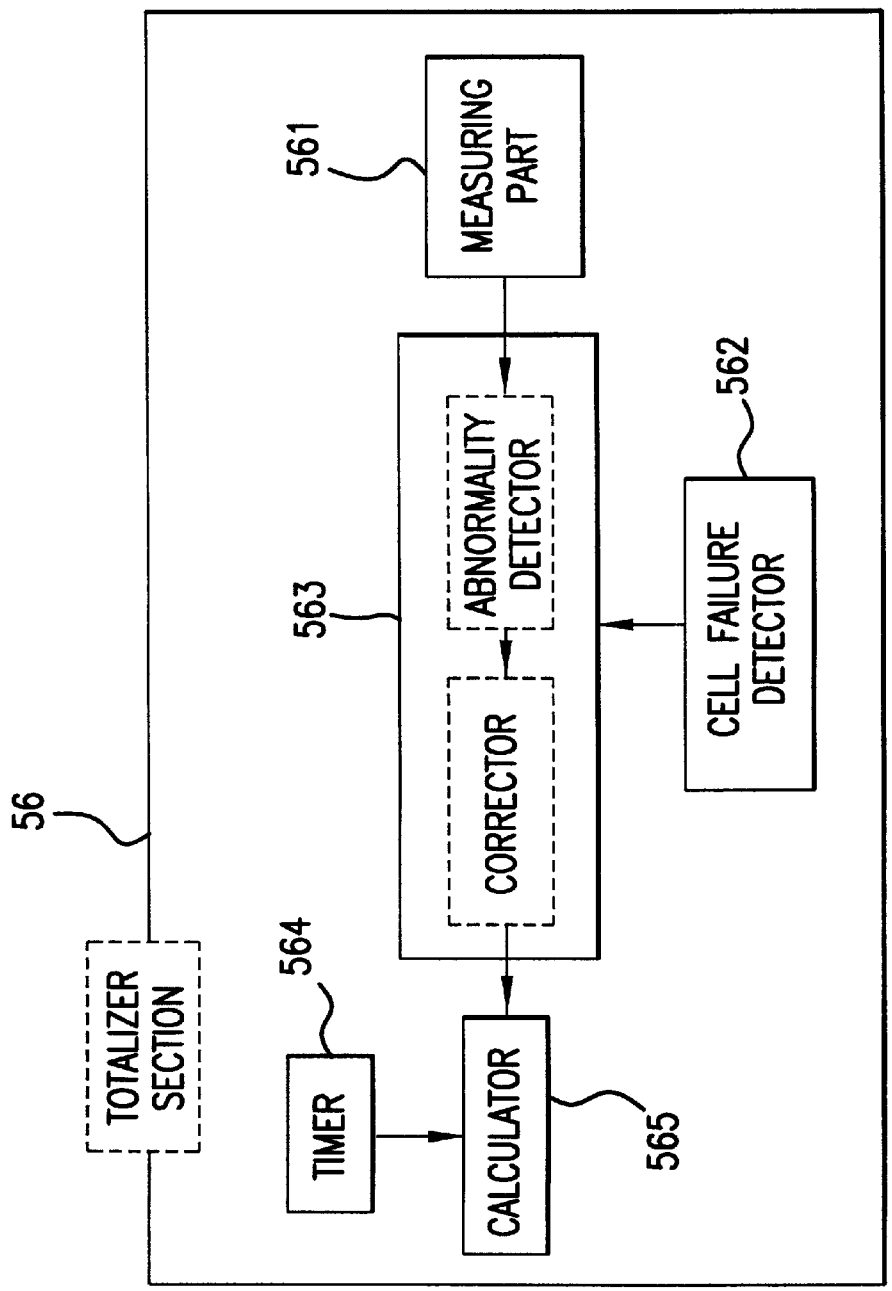
FIG. 5 is a block diagram showing the constitution of the totalizer in the block diagram of FIG. 2.

⑤ Totalizer Section 56 (FIG. 5)

The totalizer section 56, as shown in FIG. 5, comprises voltage drop amount measuring part 561, a cell failure detector 562, a corrector 563 for correcting the drop voltage measured upon detection of a cell failure, a timer part 564 which measures time, and a calculator 565 for totalizing the voltage drop amount from dropped voltage and time. In this totalizer section 56, as shown in FIG. 6 showing discharge time and battery discharge voltage, discharge voltage drop amounts are totalized from dropped voltage and time in steps of, for example, 500 W S (watts/sec) during the period from start to end of measurement.

Figure 6:
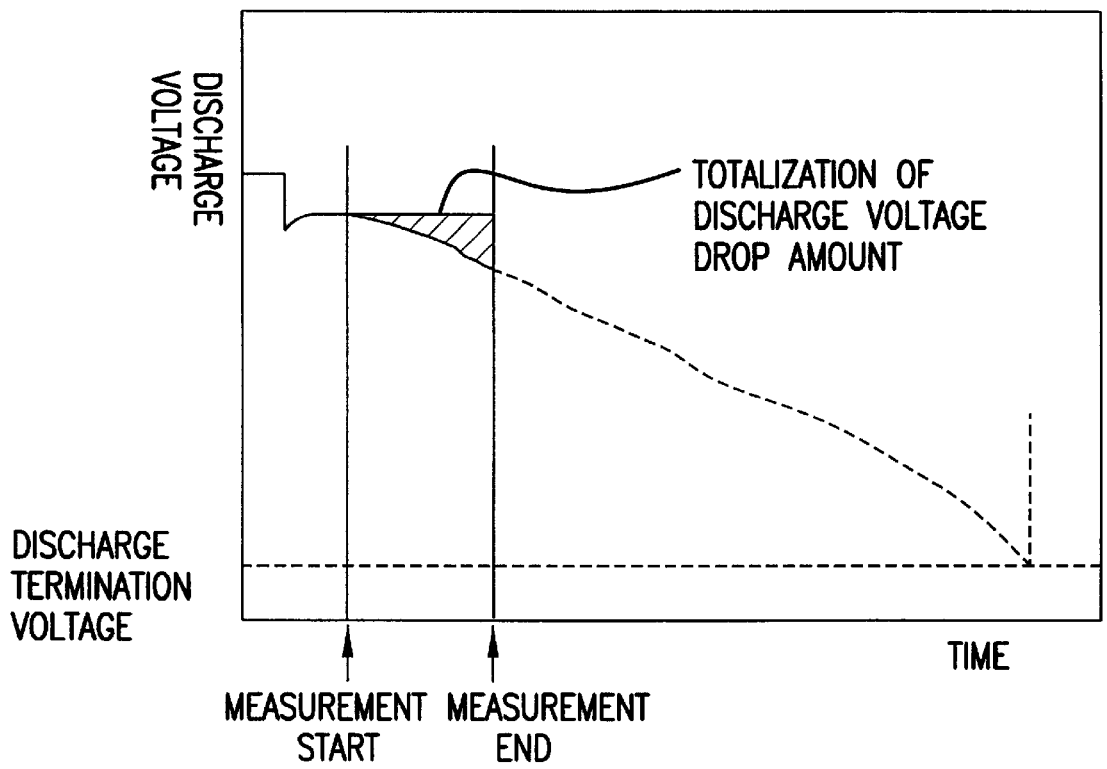
FIG. 6 shows a discharge voltage characteristic curve of a battery.
Figure 9:
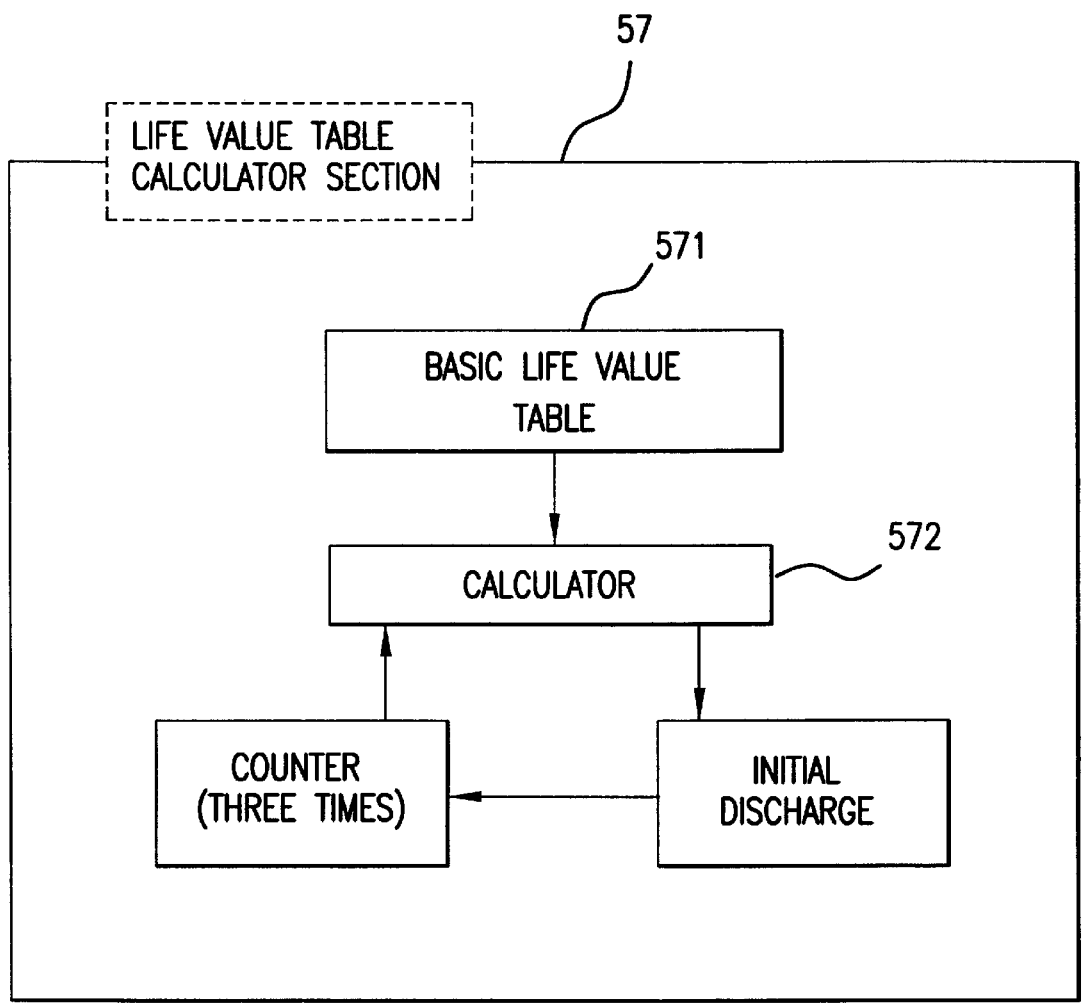
FIG. 9 is a block diagram showing the constitution of the life value table calculator in the block diagram of FIG. 2.

All total values have been previously determined by experiment and represented in a standard voltage drop amount total value table (standard total value table) so that an optimum life determination result can be obtained in correspondence to a temperature and a load capacity (see FIG. 6). Thus, calculation is iterated until the totalized value becomes a specified value represented in the total value table.

More specifically, the discharge voltage drop amount is measured by the measuring part 561. Meanwhile, when a cell failure has occurred during the measurement, the cell failure detector 562 detects it, the corrector 563 corrects the actually measured discharge voltage drop amount, and the totalizer section 565 totalizes the discharge voltage drop amounts in steps of a time interval designated by the timer 564.

The standard total value table shows four temperatures (0° C., 10° C., 25° C., 45° C.), four loads (50 W, 125 W, 250 W, 500 W), and standard discharge voltage total values (W·S) optimum for life determination with these temperature and load conditions. Accordingly, for example if the temperature is 10° C. and the load capacity is 700° C., then the voltage drop amounts are totalized until the total value becomes $a_{42}$. In the case of a temperature and load condition that is not listed in the standard total value table, for example, in the case of 15° C. and 200 W, an interpolated standard total value is determined by interpolating necessary values in the table. Also, for the sixteen standard total values in the standard total value table, there are prepared sixteen standard life value tables which show the relationship between voltage drop amount (a product of dropped voltage and time) and life value (see FIG. 7).

⑥ Life Value Table Calculator Section 57 (see FIG. 8)

Figure 10:
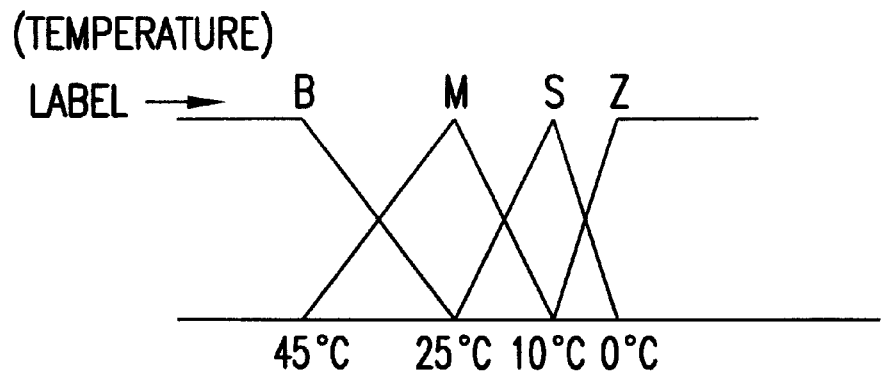
FIG. 10 is a view showing a membership function of temperature which is an input for the fuzzy inference section.
Figure 11:
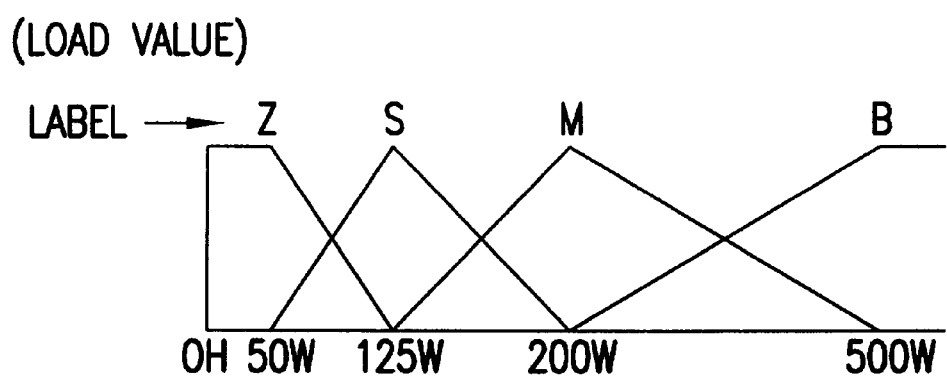
FIG. 11 is a view showing a membership function of load which is an input for the fuzzy inference section.

The life value table calculator section 57 is equipped with a sixteen-standard-life-value table 571 (see FIG. 6) in which four temperatures (0° C., 10° C., 25° C., 45° C.) and four loads (50 W, 125 W, 250 W, 500 W) are combined with one another. A calculator 572 determines a life value table for a condition (e.g., 15° C., 30 W) different from the above temperatures and loads by fuzzy interpolating the total values in the standard total value table. In addition, for the fuzzy interpolation, membership functions shown in FIGS. 10 and 11 are used.

The calculator 572 also determines a correction factor $\gamma$ by using (actual) total values measured during the three times of initial discharge, respectively, and the standard total value (or interpolated total value) determined by calculation according to the following equation (1):

$$\gamma = I/I_s \qquad \text{Equation (1)}$$

where I is the measured total value of actual measurement and $I_s$ is the standard (or interpolated) total value. Subsequently, the individual values in the standard life value table shown in FIG. 7 are multiplied by the correction factor $\gamma$, by which a specific life value table with the temperature and load at the measurement is prepared.

The correction factor $\gamma$ is determined finally by the three times of initial discharge. More specifically, a correction factor $\gamma_1$ determined during the first-time initial discharge is stored. Then, an average value $\gamma_{12}$ between a correction factor $\gamma_2$ determined during the second-time initial discharge and the foregoing correction factor $\gamma_1$ is calculated. Subsequently, the final correction factor $\gamma$ is determined based on the correction factor $\gamma_{12}$ and a correction factor $\gamma_3$ determined during the third-time initial discharge, according to the following Equation (2):

$$\gamma = (2 \cdot \gamma_{12} + \gamma_3)/3 \qquad (2)$$

The fuzzy interpolation of voltage drop amount total value based on the standard life value table is now further explained. As to the sixteen conditions in combination of the four load capacities 50 W, 125 W, 250 W, 500 W and the four temperatures 0° C., 100° C., 25° C., 45° C., there are prepared life value—difference total value tables showing the relationships between life values in steps of 10% from 0% to 100% and their corresponding difference total values of discharge voltage drop amounts (see FIG. 11), and an interpolation table of individual life values (100%, . . . , 0%) prepared based on the above tables (see FIG. 12), so that voltage drop amount total values are fuzzy interpolated by using these interpolation tables. In addition, in the tables, 1 digit means 0.05 V, where, for example, 20 digits corresponds to 1 (V·sec). For example, with a load capacity of 180 W and a temperature of 20° C., as shown in FIG. 13, difference total values corresponding to the individual life values are calculated by using the interpolation tables for the individual life values (FIG. 12), and the standard total value table is corrected by using the respective difference total values.

⑦ Determination Criteria Deciding Section 58

The determination criteria deciding section 58 decides criteria necessary for the life determination, such as measured temperature, measured load, and specific life value tables and the like corresponding to these conditions.

⑧ Determination Section 59

The determination section 59 determines the life of the battery by using the specific life value table from the voltage drop amount total values (measured values) (V·S) determined by the totalizer section 56.

⑨ Total Fuzzy Inference Section 60

The total fuzzy inference section totally evaluates by fuzzy inference the life of the battery determined by the determination section 59 based on battery charge history 61 and its charge elapsed time 62.

④ Life Determination

Figure 15:
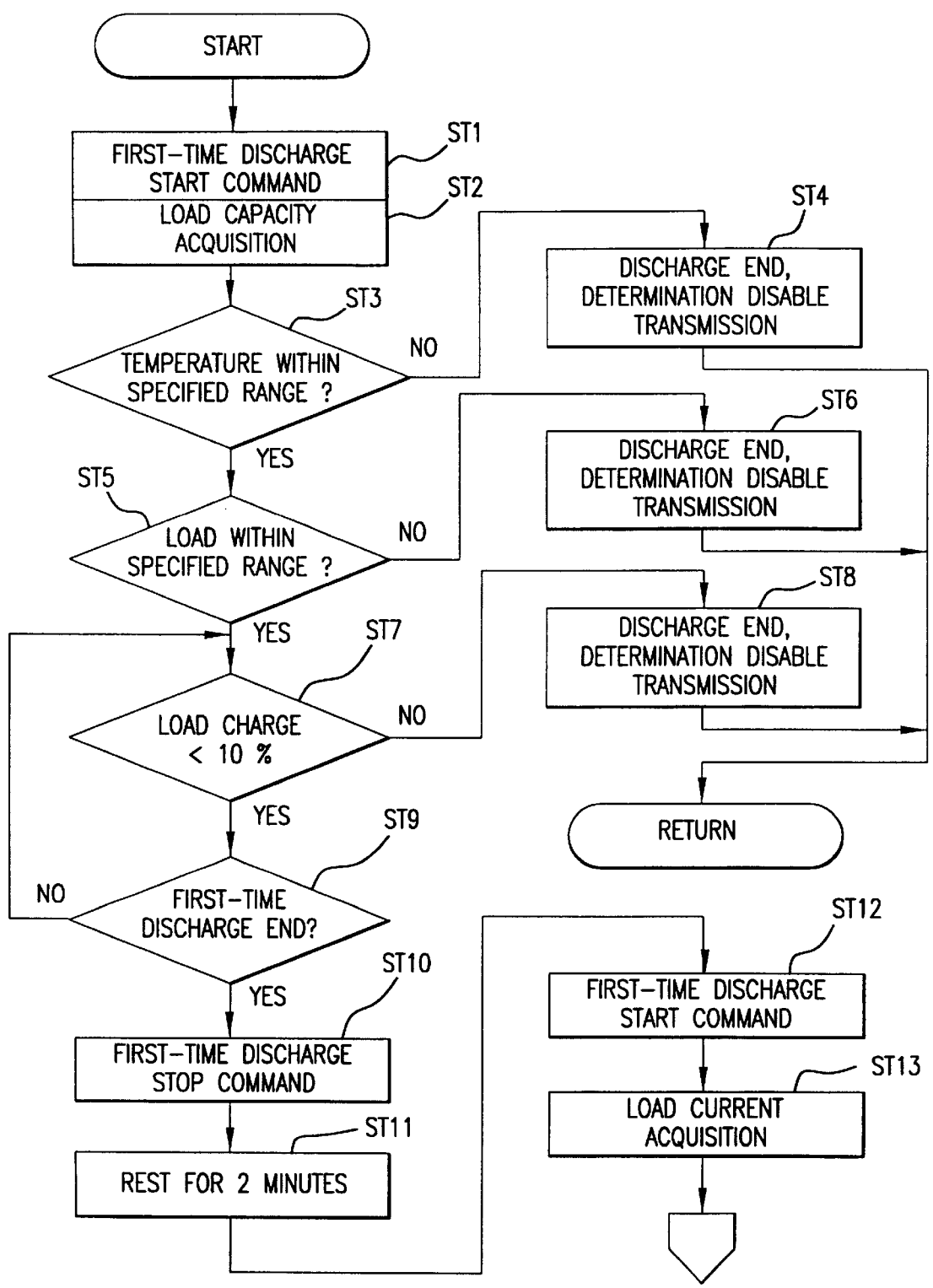
FIG. 15 is a main flow chart of the program of battery life determination process.
Figure 16:
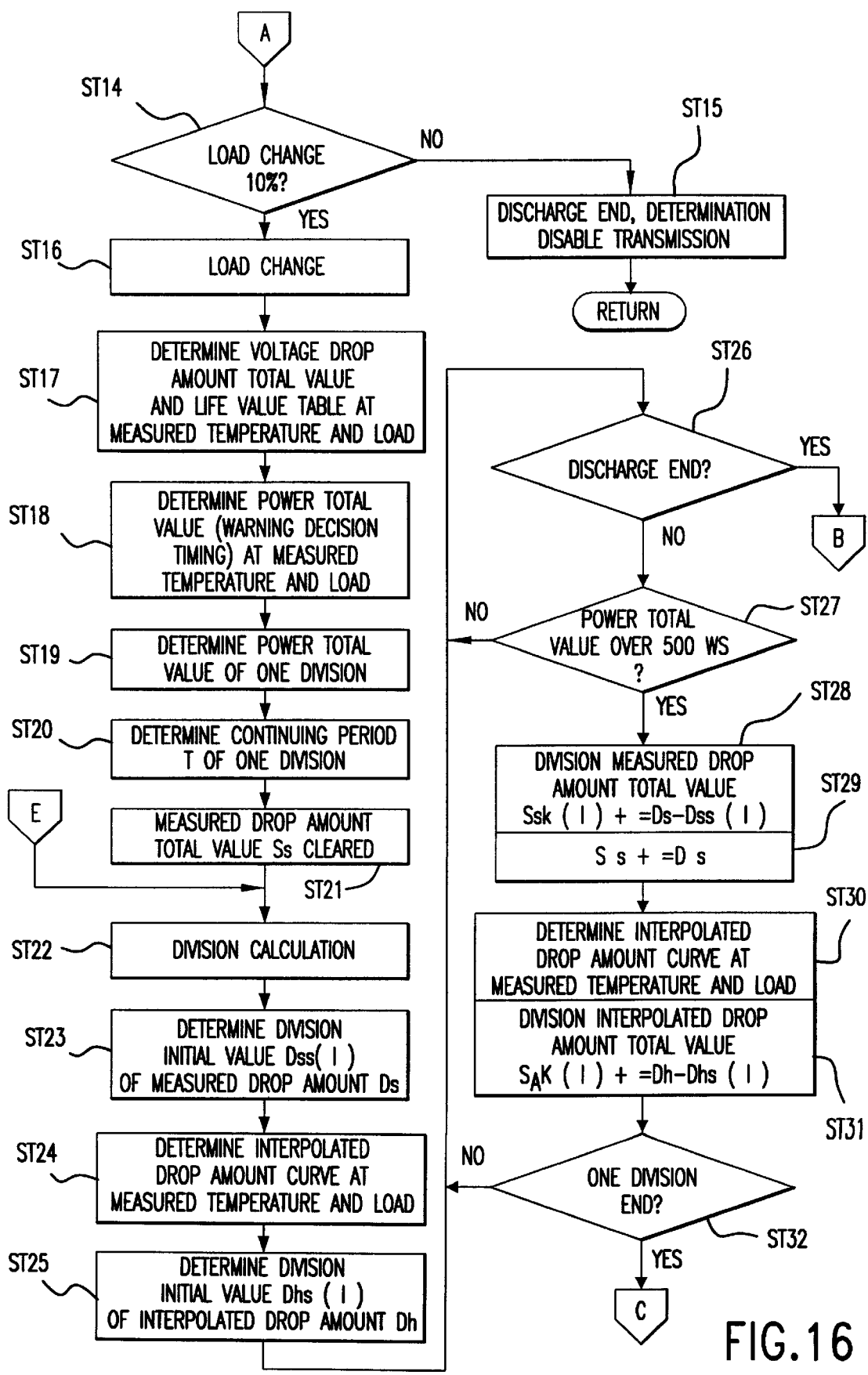
FIG. 16 is a flow chart for describing the battery life determination process together with the flow chart of FIG. 15.
Figure 17:
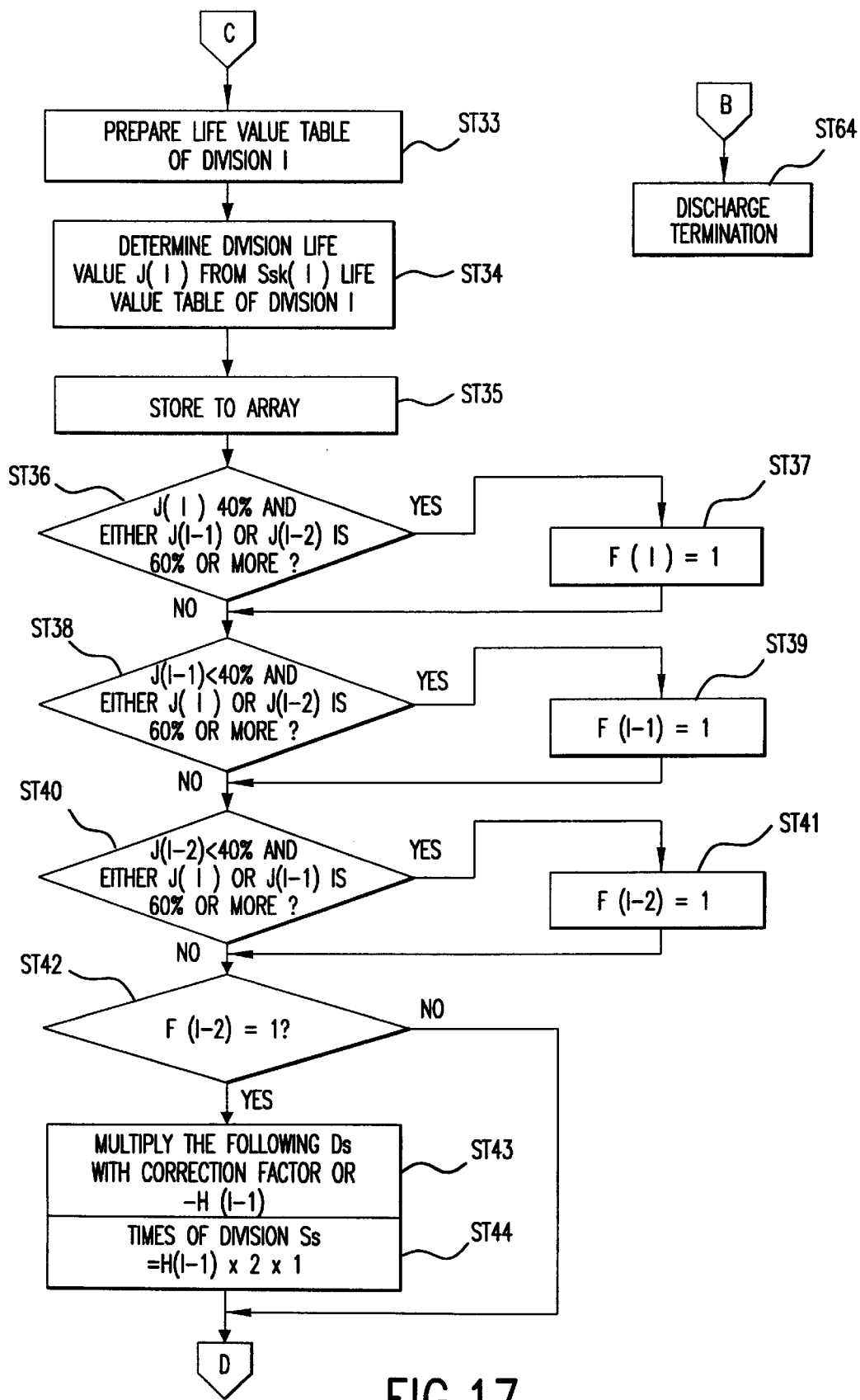
FIG. 17 is a flow chart for describing the battery life determination process together with the flow charts of FIGS. 15 and 16.

The life determination of a battery is described with reference to the flow chart of FIG. 15. It is noted that the battery life determination is performed in a state that the electrical appliance or load 40 is connected.

With the life determination started, when a first-time discharge command is prepared (ST1), the power circuit 23 is switched over by the control circuit 24 from the normal state to a backup state, where the battery 13 of the battery unit 10 is discharged to supply electricity to the electrical appliance 40. In this process, the discharge voltage decreases along the curve shown in FIG. 6, where the curve gradient differs depending on load capacity and temperature.

After a specified time elapse, for example 10 seconds, since the start of discharge, load current is measured and its load power is calculated (ST2). The measurement of load is executed eight times successively, and an average value of load power of the eight-time measurements is determined. Also, from the load power, a voltage drop amount total value and a measurement time duration optimum for the determination of life with the load are determined. This voltage drop amount total value can be obtained by a total value resulting from interpolating the standard total value table or the values in this table with reference to the temperature and load condition. The measurement time duration can be determined from voltage drop amount total value and load power. For example, with reference to the standard voltage drop amount total value table of FIG. 7, with a load power of 125 w and a temperature of 25° C., the total value is determined as 58000 WS. Next, from this total value and the load power, the measurement time duration is determined. Also, with a measurement temperature of 5° C. and a load power of 100 W, targeted total value and measurement time duration are determined by interpolating the numerical values in the standard voltage drop amount total value table.

Next, temperature is determined based on an output of the temperature sensor, and the temperature is decided whether to be within a predetermined specified range (ST3). If the temperature is out of the specified range (e.g., 0–40° C.), the discharge is stopped and a discharge disable is transmitted, the program being ended (ST4). If the temperature is within the specified range, then load capacity is determined based on the output of the load sensor, and the load capacity is decided whether to be within a specified range (ST5). If the load is outside the specified range, the discharge is stopped and a discharge disable is transmitted, the program being ended (ST6). If the capacity is within the specified range, then it is decided whether the load power shift average value at a time point when each load measurement is ended has changed to an extent of 10% or more of the shift average value that has been obtained up to the preceding time (ST7). If a 10% or more load change has occurred, the discharge is stopped and a determination disable is transmitted, thus the program being ended (ST8). If the load change is below 10%, it is decided whether the measurement time duration that has last been determined has elapsed (ST9), where the processes of ST7 and ST8 are iterated every one second until the time duration elapses. In an elapse of the measurement time duration, the first-time initial discharge is ended (ST10), where the power circuit 23 is switched over by the control circuit 24 so that the backup state is returned to the normal state, and the battery is set to a charge state and activated. This charge state continues for two minutes (ST11).

Upon completion of the activated charge, a second-time discharge command is issued (ST12), and the discharge effective for life determination is started, where the power circuit 23 is switched over by the control circuit 24 so as to be set from the normal state to the backup state. Also, as in ST2, load current is measured (ST13), where it is decided whether the load change is 10% or more (ST14). If the load change is 10% or more, the discharge is stopped and a determination disable is transmitted, thus the program being ended (ST15). If the load change is below 10%, the load change value is stored (ST16). The load change value stored here is utilized in the correction of the life value table. For example, when a 5% load change has occurred, the correction factor $\gamma$ is corrected by 5%, and by using the corrected correction factor, measurement conditions and the specific life value table of the battery 13 mounted are corrected later.

Subsequently, based on the standard total value table, temperature in measurement, interpolated total value Ss of load capacity and specific life value table are determined by fuzzy interpolation (ST17). Also, an interpolated total value table for the temperature and load capacity in the measurement is prepared (ST18). Further, the totalization region (a region ranging from the measurement start to the measurement end) is divided into 10 divisions, and measured total values of the respective divisions (division total values) are calculated (ST19).

In the following steps of ST19 to ST44, cell failure is detected. First, in the ST19, the respective division total values are divided by the load capacity to determine time durations of the respective divisions (ST20). Although the time duration of each division will vary depending on temperature and load capacity, in general, the division total value of one division is about 1670 WS and the division time duration is about 7 seconds. The process now entering into the calculation of voltage drop amount for each division, the voltage drop amount total value Ss is cleared (ST21), and the life value calculation for each division is started.

First, a measured voltage drop amount Ds from the discharge voltage at the start of measurement, and a first voltage drop amount (division initial value) Dss (I) for each division are determined (ST23).

Next, the voltage drop amount table interpolated for the temperature and load capacity in measurement are determined (ST24). This interpolated voltage drop amount table is determined in the following way. For example, with a temperature of 20° C. and a load capacity of 180 W, an interpolated voltage drop amount table of FIG. 20 is prepared from sixteen standard tables of voltage drop amounts and progressive power total values which are combinations of four load capacities and four temperatures (see FIG. 19). Then, from this interpolated voltage drop amount table, interpolation results shown in FIG. 21 for the load capacity of 180 W and the temperature of 20° C. are obtained.

Subsequently, from the interpolated voltage drop amount table, a standard voltage drop amount Dh and initial voltage drop amounts (division initial values) Dhs (I) for the individual divisions corresponding to the foregoing ten-divided divisions are determined (ST25).

Then, it is decided whether the discharge has been ended (ST26), and if the discharge has been ended, the discharge process is ended (ST64). Further, a complete deterioration transmission is performed for decision of an alarm, and an alarm transmission is performed for decision of a warning. If the decision result at ST26 is NO, it is decided whether the discharge voltage drop amount total value has reached 500 WS (ST27). If the result is NO, the program returns to ST26, where the processes of ST26 and ST27 are iterated until the total value exceeds 500 WS; if the result is YES, the Ds−Dss (I) is added to the measured division voltage drop amount total value Ssk (I) (ST28), and Ds is added to the measured voltage drop amount total value Ss (ST29). In this case, if the steps of 500 WS stretch over a division boundary, the measured voltage drop amount Ds of the step is proportionally divided by total values belonging to the respective divisions, and proportionally divided values belonging to the respective divisions are totalized.

At ST30, an interpolated voltage drop amount table with the temperature and load capacity in measurement is determined. Then, the interpolated drop amount Dh–interpolated drop amount division initial value Dhs (I) is added to the division voltage drop amount total value Ssk (I) (ST30), where it is decided whether one division has been ended (ST32). The processes of ST26 to ST32 are iterated until one division is ended, by which the division interpolated drop amounts of one division are totalized.

Figure 22:
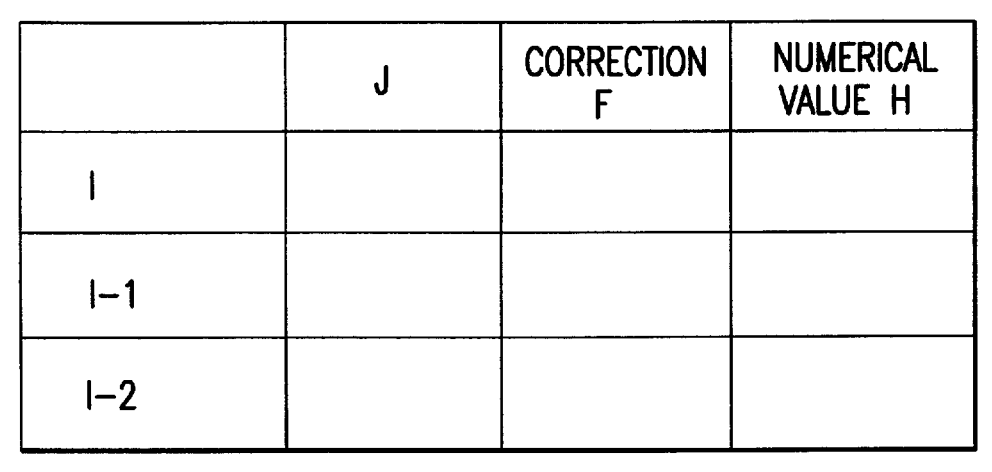

Next, the interpolated life value table is multiplied by the division interpolated drop amount total value Shk (I) and thereafter divided by the values of 100% total value table, by which a life value table for division I is prepared (ST33). Then, a division life value J (I) is determined (ST34), and stored in the array shown in FIG. 22 (ST35). In FIG. 22, I represents a division under the current calculation, I-1 represents a division one before the division I, and I-2 represents a division two before the division I. Character J represents the division life value, F represents a flag for correcting any cell failure and H represents a numerical value needed to correct the cell failure. This numerical value H(K) is given by the following equation (3):

$$H(K)=Dss(K)-Dhs(K) \qquad \text{Equation (3)}$$

For decision as to whether it is a cell failure, it is first decided whether the division life value J(I) is smaller than 40% and moreover either the division life value J(I-1) or the division life value J(I-2) is not less than 60% (ST36). If YES, the flag F(I) is set to 1 (ST37), the program going to ST38. If NO, the program jumps ST37, going to ST38. At ST38, it is decided whether the division life value J(I-1) is smaller than 40% and moreover either the division life value J(I) or the division life value J(I-2) is not less than 60%. If YES, the flag F(I-1) is set to 1 (ST39), the program going to ST40. If NO, the program jumps ST39, going to ST40.

At ST40, it is decided whether the division life value J(I-2) is smaller than 40% and moreover either the division life value J(I) or the division life value J(I-1) is not less than 60%. If YES, the flag F(I-2) is set to 1 (ST41), the program going to ST42. If NO, the program jumps ST41, going to ST42. At ST42, it is decided whether the flag F(I-2) is 1. If YES, a cell failure is decided, where the correction value H(I-1) is subtracted from the following measured drop amounts Ds (ST43), and 2·H(I-1) multiplied by the number of times of totalization for one division is subtracted from the measured drop amount total value Ss (ST44).

In this embodiment, a cell failure is detected in the above-described way, and after the detection of a cell failure, a life determination result for the succeeding division is corrected, so that the factors of cell failure are eliminated from the life determination results.

Figure 23:
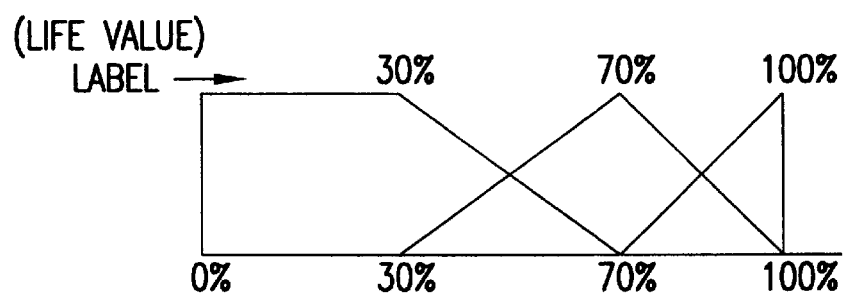
FIG. 23 is a view showing a membership function of life value which is an input for the fuzzy inference section.
Figure 24:
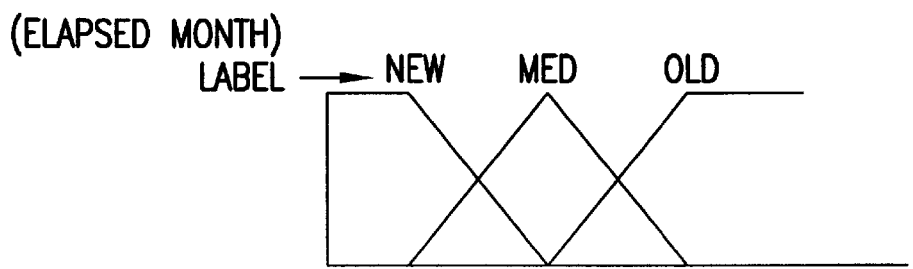
FIG. 24 is a view showing a membership function of elapsed months which are an input for the fuzzy inference section.
Figure 25:
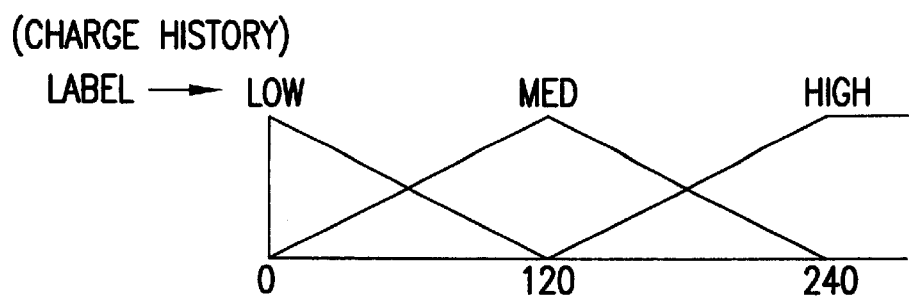
FIG. 25 is a view showing a membership function of charge history which is an input for the fuzzy inference section.
Figure 26:
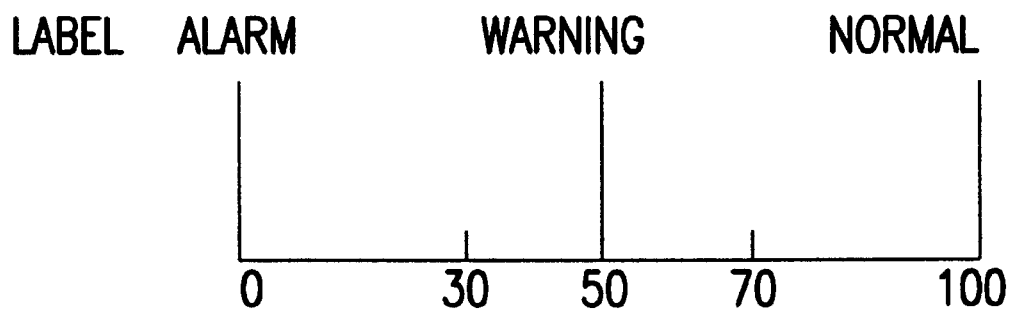
FIG. 26 is a view showing a membership function of the conclusion part of the fuzzy inference section.

Next, it is decided whether the battery has considerably deteriorated, during the battery life determination process. For this purpose, it is decided at ST45 whether I is 4, where if YES, an alarm level decision is executed in the processes of ST46 and the following. In this alarm level decision, a life value is first determined from the measured drop amount total value Ss, the resulting life value is stored or updated (ST46), and then it is decided at ST47 whether the battery has deteriorated, from the battery's charge characteristics by fuzzy inference. For the fuzzy inference in this case, a life value membership function (see FIG. 23), an elapsed-month membership function since the start of use of the battery (see FIG. 24) and a charge history membership function (see FIG. 25) are used as input values, and the labels of the membership functions in the conclusion section (FIG. 26) are normal, warning and alarm. Fuzzy rules are shown in FIG. 27, where charge histories Low (0), Mid (120), HIGH (240) (each numerical value being obtained by dividing by 10 a product of temperature and the number of elapsed months) are shown in upper, middle and lower stages, elapsed months NEW (12), MED (36) and OLD (60) (each numerical value being an elapsed month) are shown along the direction of rows in the respective stages, and further life values 100%, 70% and 30% are arrayed along the direction of columns of the respective stages in three dimensions, in which life values can be determined by weighted averages of these values. The calculation is executed in the following order: (1) 27 fitnesses are multiplied by the life values 100%, 50% and 0% of the conclusion section for each matrix; (2) all the 27 calculated values are added up and the addition result is divided by a total fitness (a value obtained by summing up the 27 fitnesses). The calculated values are weight-averaged. As a result of this calculation, the battery is decided as "normal" for a life value of 100–70, as "warning" for a life value of 70–30, and as "alarm" for a life value of 30–0.

Figure 18:
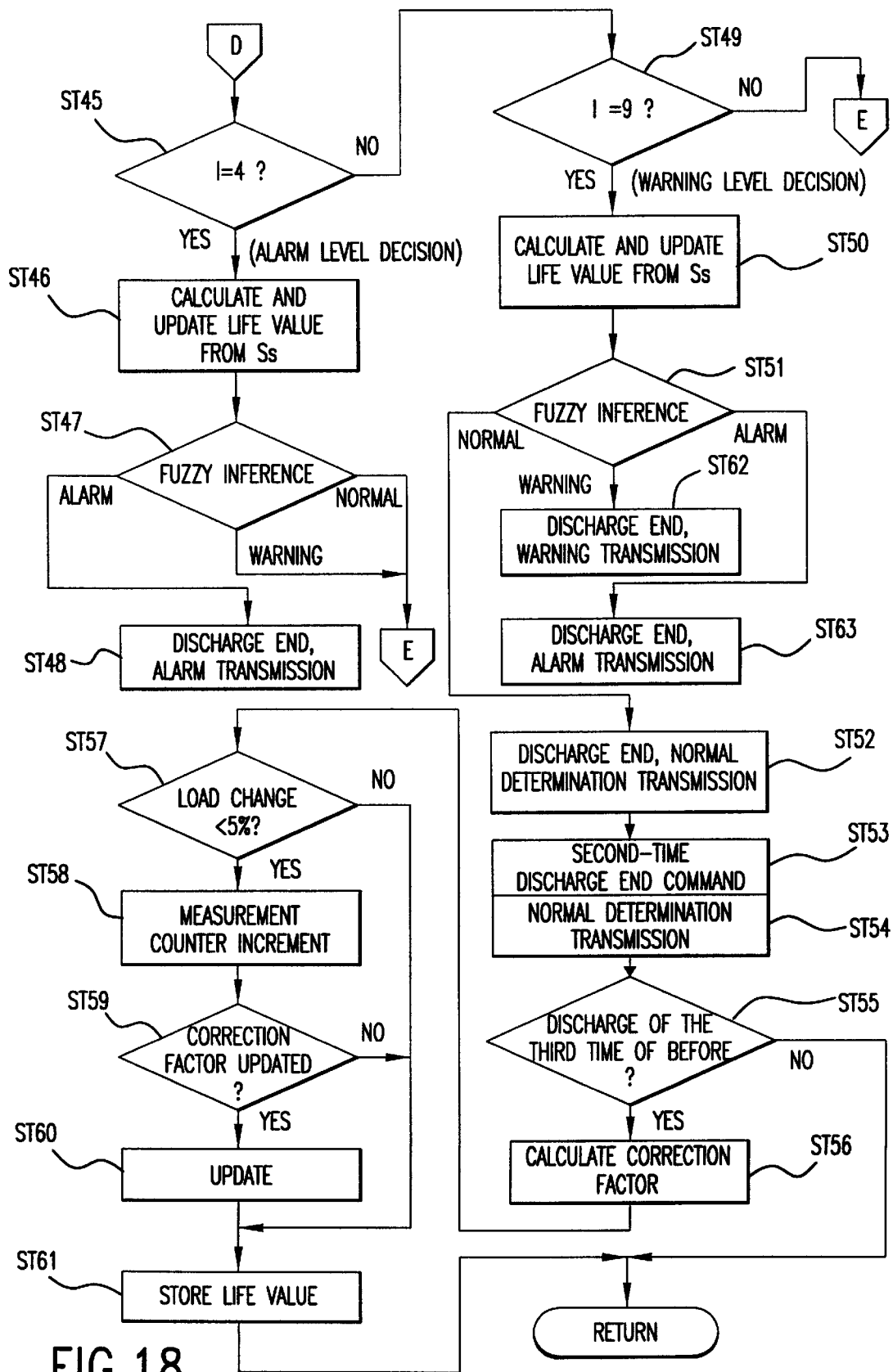
FIG. 18 is a flow chart for describing the battery life determination process together with the flow charts of FIGS. 15 to 17.

Referring back to the flow chart of FIG. 18, if the result of the fuzzy inference at ST47 is an alarm, then the discharge is ended and the alarm is issued (ST48). Also, if the result of the fuzzy inference is a normal or a warning, then the program returns to ST22 to enter the calculation for the succeeding division, i.e., a division I=5.

If I has been decided not to be 4 at the decision of ST45, then it is decided at ST49 whether I is 9. If YES, i.e., if the program enters the calculation for division I=9, then a warning level decision which is the final process of the processing after ST50 is executed. In this warning level decision, a battery life value is first calculated from the voltage drop amount total value Ss and stored (ST50). Subsequently, as in ST47, by taking as input values the membership functions of life values, charge histories and elapsed months, it is decided by fuzzy inference which state the battery is in among the normal, warning or alarm states. The membership functions are those used in ST47.

As a result of the fuzzy inference, if the battery is decided as the normal state, the discharge is ended while the decision result is transmitted (ST52), a second-time discharge end command is issued (ST53) and a normal decision is transmitted (ST54). Subsequently, it is decided whether the discharge to be next executed is at the third time (ST55), where if it is decided as the third time, the program goes to ST56 and calculates the correction factor as described above. Next, it is decided whether the load change is smaller than 5%, where if YES, a counter for counting the number of times of initial discharge is incremented (ST58), the correction factor is updated (ST60) and the battery life value is stored (ST61).

If the result of the fuzzy inference at ST51 is a warning, the discharge is ended and a warning is transmitted (ST62). If the result of fuzzy inference is an alarm, the discharge is ended and an alarm is transmitted (ST63).

Figure 28:
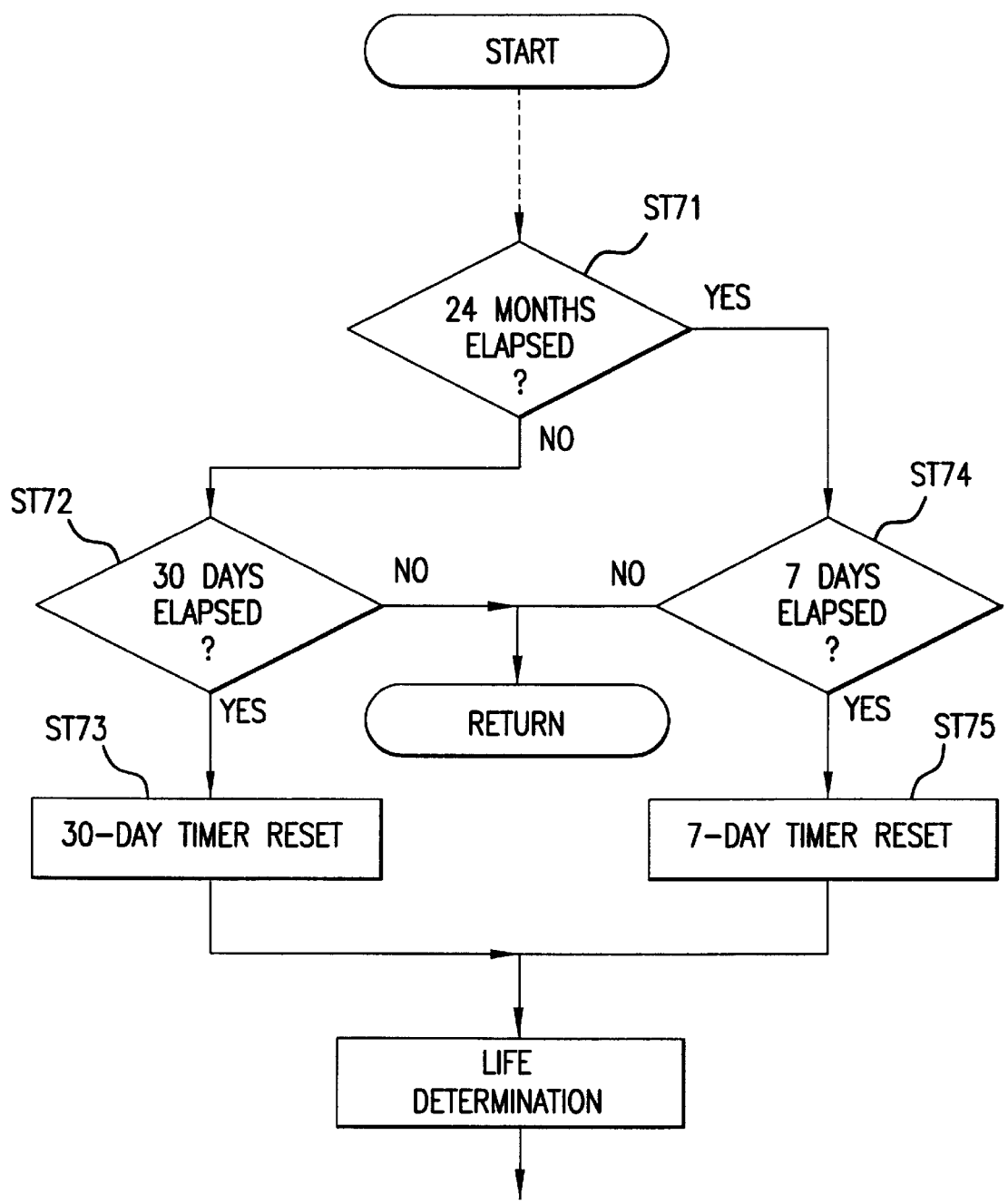
FIG. 28 is a flow chart showing part of a main flow chart of the uninterruptible power supply.

The life determination described above is executed periodically as shown in the flow chart of FIG. 28. Before 24 months elapse since the start of use of the battery of the connected battery unit, the decision at ST71 as to whether 24 months have elapsed would be a NO, in which case it is decided whether 30 days have elapsed since the day of the preceding-time life determination (ST72). A standby state is kept until 30 days elapse, and the 30-day timer is set when 30 days have elapsed (ST73), thus the life determination process being started. That is, the life determination process is executed every 30 days before 24 months elapse since the start of use of the battery.

When 24 months have elapsed since the start of use of the battery, the decision at ST71 would be a YES, where it is decided whether 7 days have elapsed since the day of the preceding-time life determination (ST74). A standby state is kept until 7 days elapse, and a 7-day timer is reset when 7 days have elapsed (ST75), thus the life determination being started.

In the above embodiment, the uninterruptible power supply is so constructed that the battery unit and the control unit are provided independently of each other. However, these may be integrated into one unit, or the control unit may be integrated with the electrical appliance.

Figure 29A:
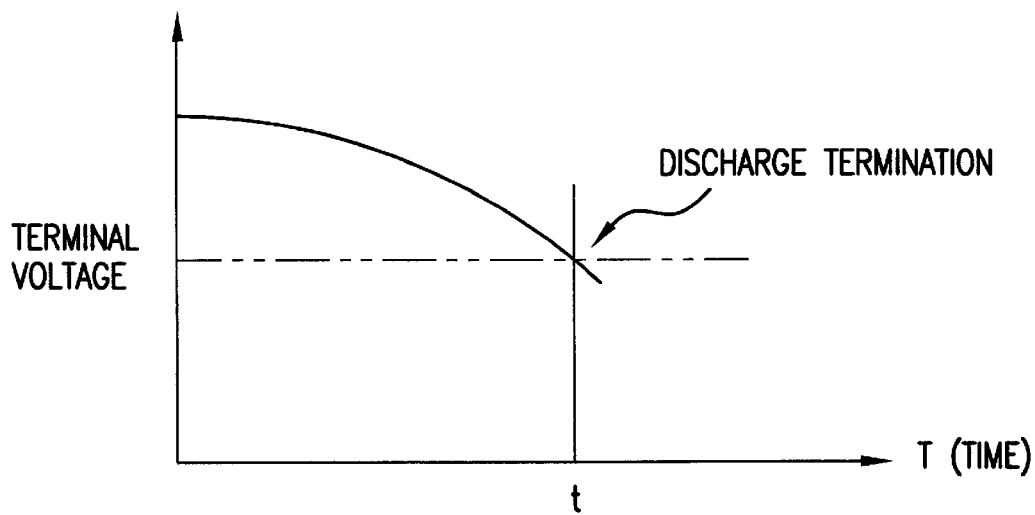
FIG. 29 is a view for describing the cell failure of a battery.
Figure 29B:
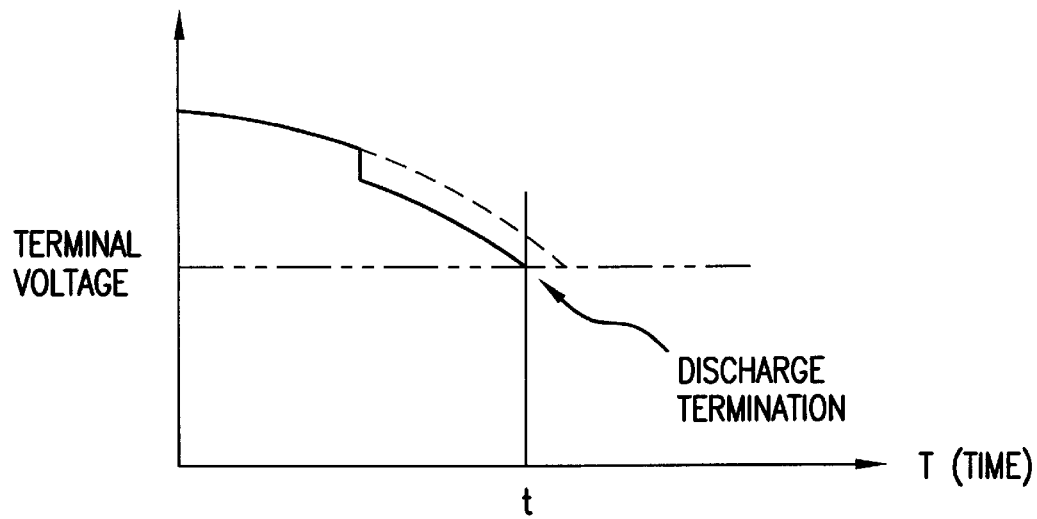
Figure 29C:
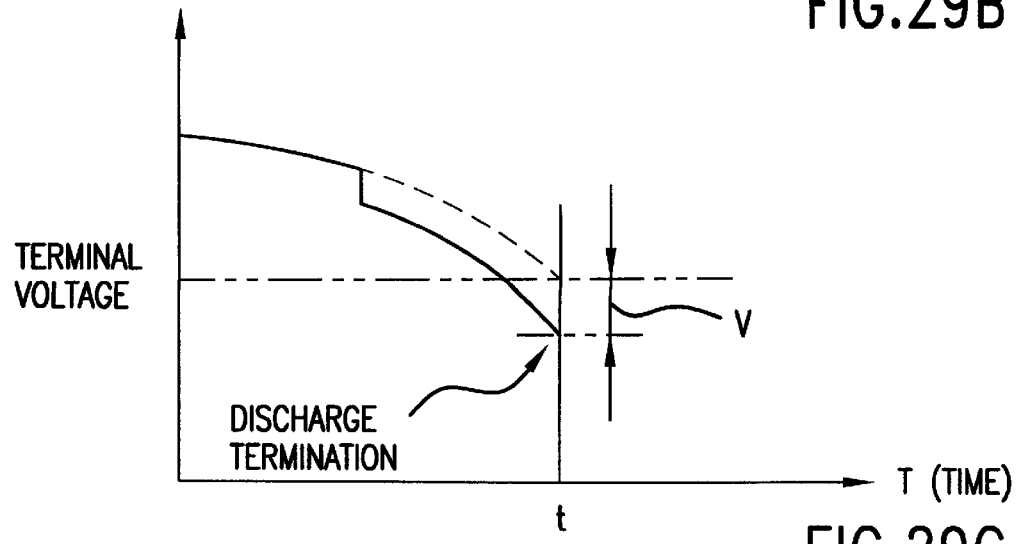

Also, in the uninterruptible power supply, it is also possible that when a cell failure of a battery is detected, the discharge stop voltage is set 2 V lower as shown in FIG. 29 (c) so that the other cells free from any cell failure can be effectively utilized.

Further, the relationships between voltage drop amount total value and life value and the like are stored in the form of table. However, these may also be stored in the form of functional equation, or life values and the like may be calculated by performing arithmetic operations with actual measured data.

As described above, according to the present invention, discharge voltage drop amounts are totalized from the start of discharge of the battery until the elapse of a specified time, and the life value is determined from the resulting total value. Therefore, the life determination result is less likely to be affected by load variations or the like.

Also, the correction factor is determined through a plurality of times of initial discharge and the characteristics of the individual batteries are corrected. Therefore, the life can be accurately determined regardless of characteristic variations among the batteries.

Further, when a temperature change over a specified value has occurred during the life determination, the life is re-determined after a specified time of standby state. Therefore, the life can be determined in the state that inside and outside of the battery has become equal in temperature to each other. Therefore, an accurate life determination that is not affected by the temperature change is enabled.

Furthermore, the period for life determination is changed according to time elapses since the start of use of the battery. Therefore, an accurate life determination can be achieved even with deteriorated batteries.

Since the life determination is executed after correcting the discharge voltage drop amounts by detecting cell failures, an accurate life determination can be achieved regardless of any characteristic changes due to a cell failure.

Furthermore, since the life determination is executed by fuzzy inference with inputs of life values determined from discharge voltage drop amount total values, charge histories and elapsed time, there never arise such irrational results as a slight remaining life of a battery that has just started being used.

Also, since the discharge end voltage is set lower by a specified value upon detection of a cell failure, the discharge time is prolonged responsively so that the other cells free from any cell failure can be effectively utilized.

(5) Monitoring Function

Figure 30:
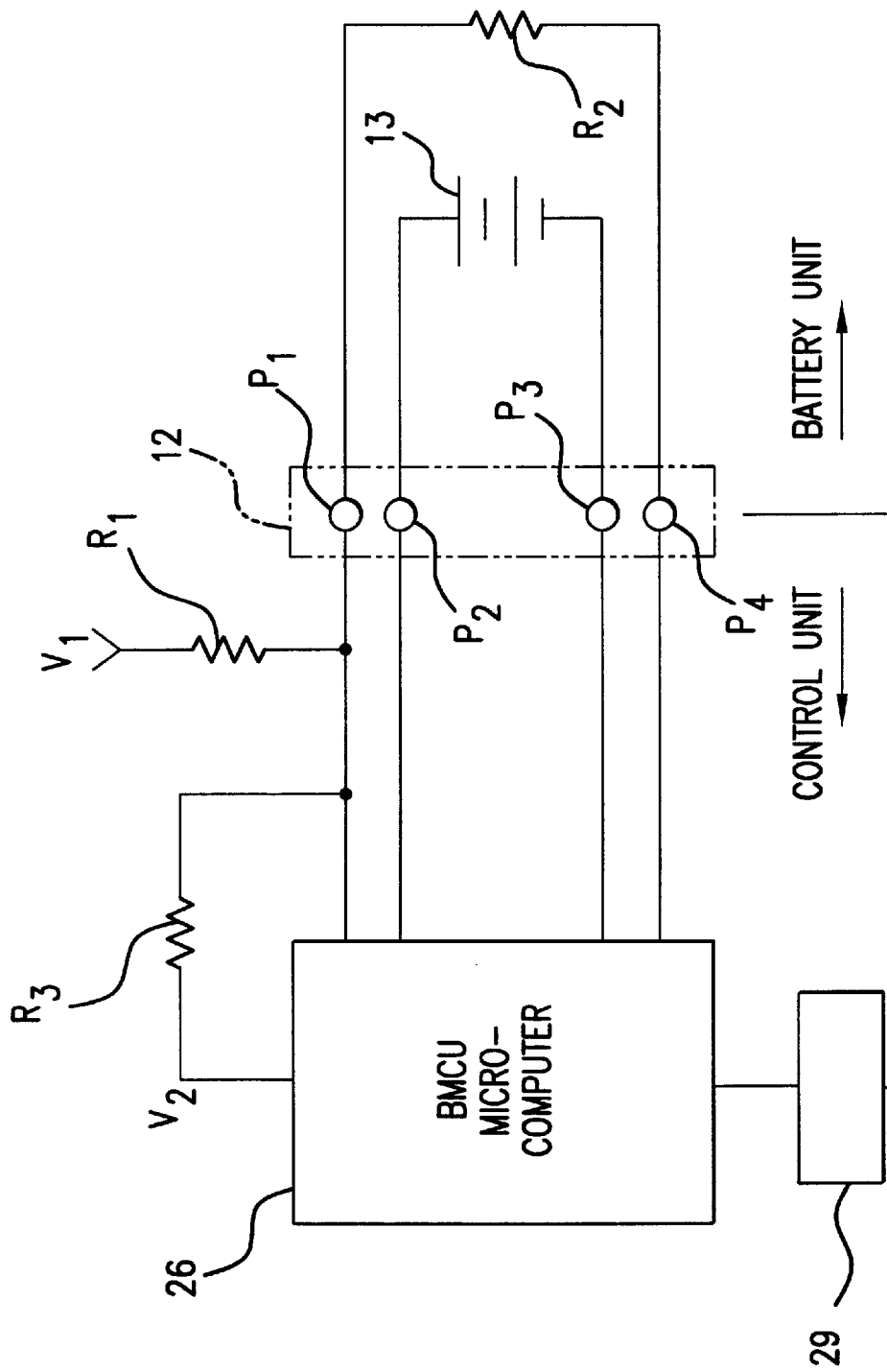
FIG. 30 is a view for describing the function of monitoring the connection state of the control unit to the battery unit.

The monitoring function of the BMCU microcomputer 26 is described. FIG. 30 is a circuit diagram showing the connection between the BMCU microcomputer 26 and the battery unit 10 in the uninterruptible power supply 1. The battery 13 of the battery unit 10 is connected to the BMCU microcomputer 26 via terminals $P_2$, $P_3$ of the connectors 12 and a resistor $R_1$ of the battery unit 10 is connected to the BMCU microcomputer 26 via terminals $P_1$, $P_4$ of the connectors 12. Also, one end of the resistor $R_1$ is connected to a line which is connected to the terminal $P_1$ of the connector of the BMCU microcomputer, while a voltage $V_1$ is given to the other end of the resistor $R_1$. Further, a battery for backup use is provided in the BMCU microcomputer 26, and a voltage $V_2$ of this battery is connected to a line which is connected to the terminal $P_1$ of the connector of the BMCU microcomputer via the resistor $R_3$.

In this circuit, the resistance value of the resistor $R_3$ is set larger as compared with those of the resistances of resistors $R_1$, $R_2$ (about 10 k$\Omega$), where the voltage $V_1$ is divided by the resistors $R_1$, $R_2$ and the voltage $V_2$ is divided by the resistors $R_3$, $R_4$. With the power supply ON, i.e., when the control unit 20 is powered from commercial power supply, the voltage $V_1$ is given from the power source section, in which case divided voltages of the resistors $R_1$ and $R_2$ are captured into the BMCU microcomputer 26 and the voltages are converted into digital values by a built-in A/D converter. In this case, the larger the number of battery units to be connected to the control unit 20 is, the large the number of parallel connections of the resistor $R_1$ becomes, and therefore the smaller the combined resistance value between the terminals $P_1$ and $P_4$ becomes so that the voltage of the terminal $P_1$ also becomes smaller. Therefore, the number of connected battery units can be known depending on the magnitude of the value of the voltage of the terminal $P_1$ that has been A/D converted and captured.

While the power supply is in the OFF state, the voltage $V_1$ is not given. Therefore, with the power supply OFF, the presence or absence of connection of the battery unit 10 to the control unit 20 is detected by using the divided voltages by the resistors $R_2$, $R_3$, depending on whether the signal transmitted via the line of the terminal $P_1$ is an H or an L. If the battery unit 10 is not connected, the terminal $P_1$ is in the open state so that the signal is pulled up to be an H. If the battery unit 10 is connected, the terminal $P_1$ has divisional portions of the voltage $v_2$ by the resistors $R_3$, $R_2$, where because $R_3 \gg R_1$, the terminal $P_1$ is pulled down to be an L. These H and L are discriminated and stored, by which the presence or absence of the connection of the battery unit 10 can be detected and recorded.

Figure 31:
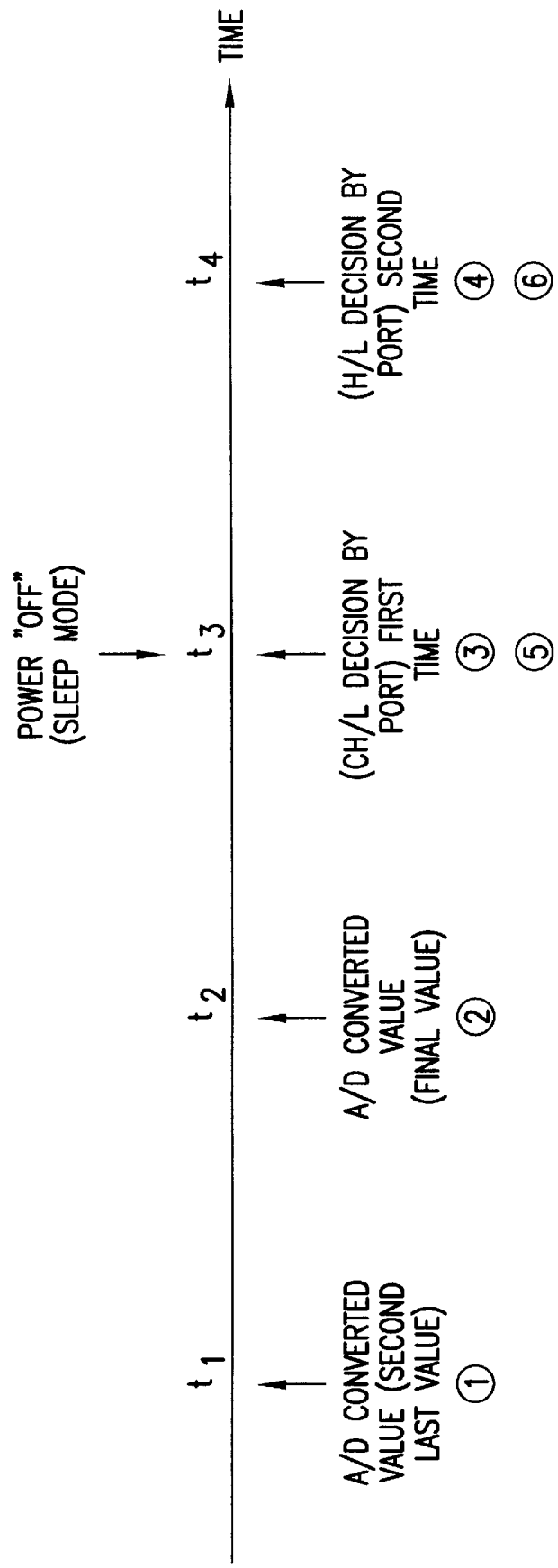
FIG. 31 is a time chart for describing the operation of the monitoring function upon a change of the AC power supply from the ON state to the OFF state.
Figure 32:
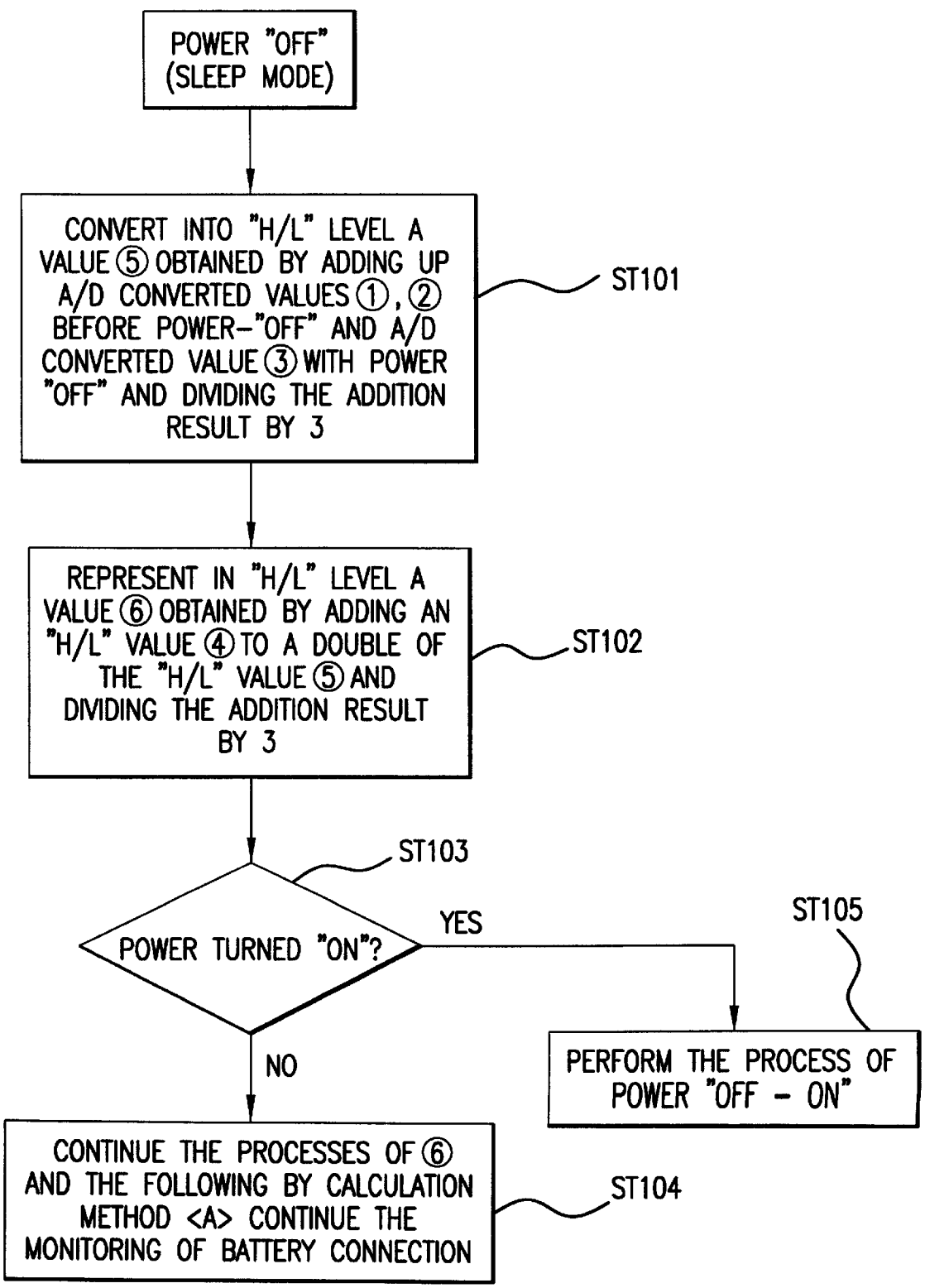
FIG. 32 is a flow chart for describing the operation of the monitoring function upon a change of the AC power supply from the ON state to the OFF state.

Assuming that the power supply to the control unit 20 has been in the ON state and is now changed to the OFF state, the battery monitoring operation is described with reference to the time chart of FIG. 31 and the flow chart of FIG. 32. FIG. 31, in which the time elapse is represented right to left, shows a case where a change from ON to OFF state occurs at a time point $t_3$. At the time point $t_2$, a final A/D conversion value ② at the terminal $P_1$ is obtained. At the time point $t_1$, which is further one sampling before that, an A/D conversion value ① in the second last place is obtained.

When the power supply is turned OFF, i.e. comes into the sleep mode, at time point $t_3$, then the BMCU microcomputer 26 first totalizes the A/D conversion values ① and ② before the turn-OFF of power, and further totalizes the A/D conversion value ③ at the turn-OFF, i.e. the time point $t_3$, divides the result by three to obtain a shift average, and then converts the resulting value ⑤ into either H or L level (ST101).

At the next sampling time point $t_4$, the BMCU microcomputer 26 adds the value of H or L of the terminal $P_1$ at the time point $t_4$ to a double of the value of H or L ⑤ divides the result by three, and represents the resulting value ⑥ in H or L (ST102). Thereafter, each time the sampling time comes up, it is decided whether the power supply for the control unit 20 has been turned ON (ST103), where if it has not been turned ON, then the shift average of H and L is iterated and the monitoring as to whether the terminal $P_1$ is an H or an L, i.e., the connection of the battery unit, is continued. If the power supply is changed from OFF to ON state at a sampling time point, then a YES is decided at ST103, where the program moves to the processing of turning the power supply from OFF to ON state (ST105).

Figure 33:
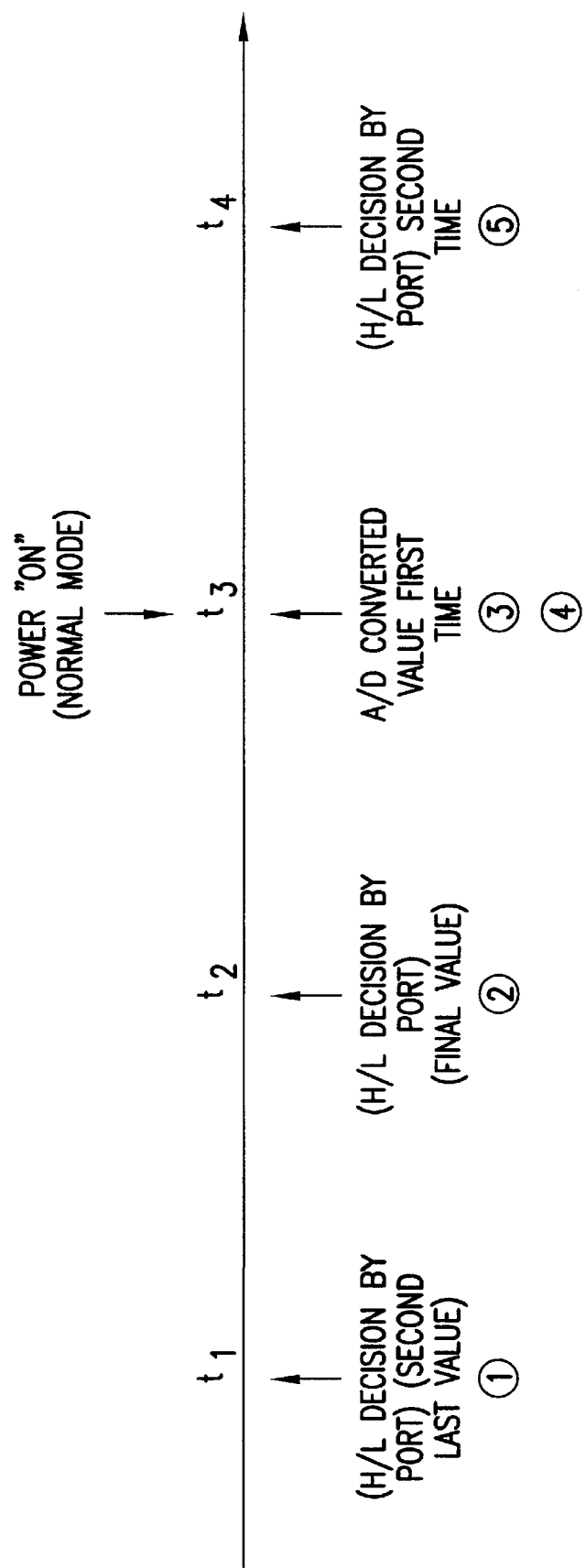
FIG. 33 is a time chart for describing the operation of the monitoring function upon a change of the AC power supply from the OFF state to the ON state.
Figure 34:
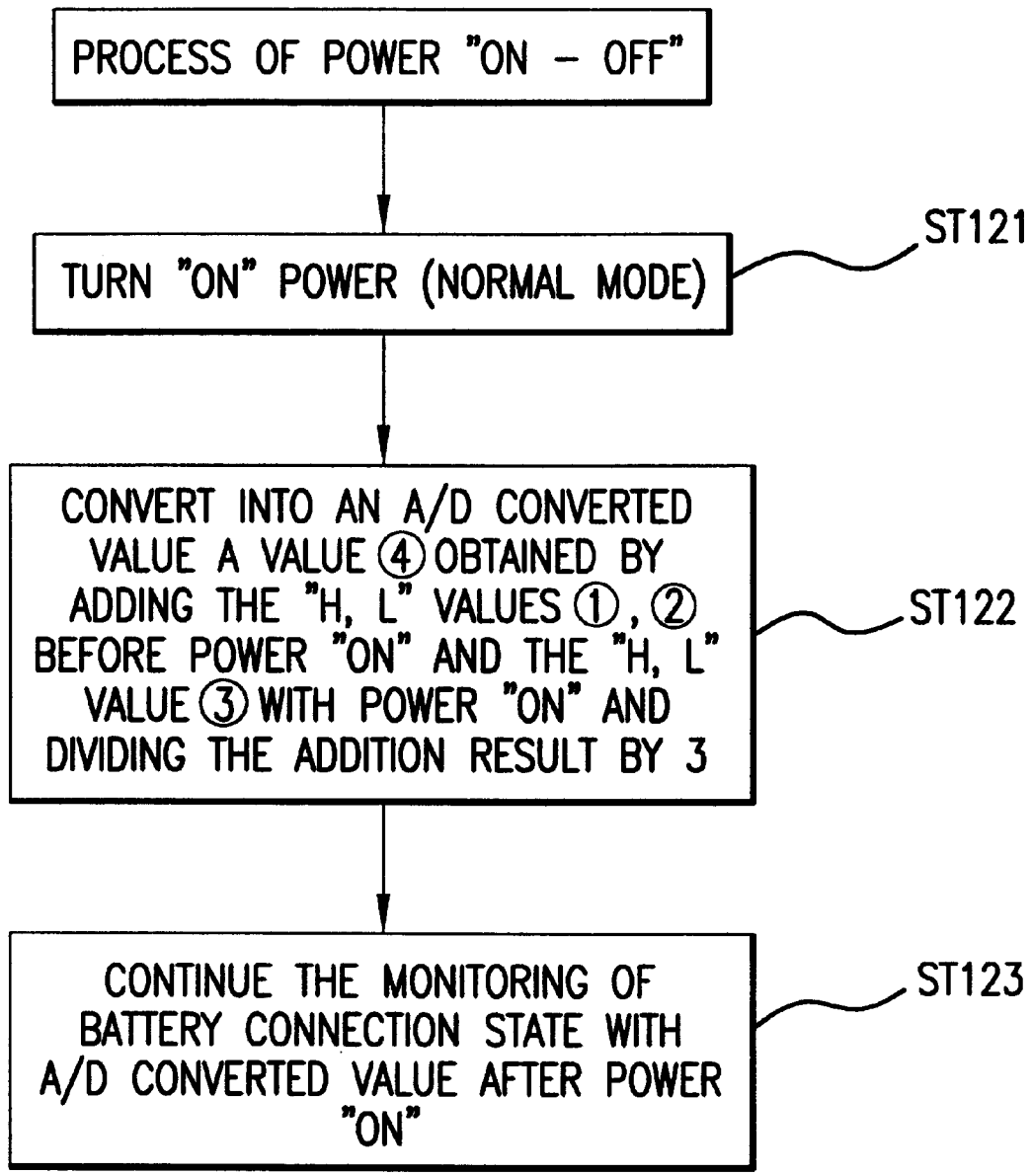
FIG. 34 is a flow chart for describing the operation of the monitoring function upon a change of the AC power supply from the OFF state to the ON state.

Subsequently, the processing operation for turning the power supply from OFF to ON state is described with reference to the time chart of FIG. 33 and the flow chart of FIG. 34. Because the OFF processing is done at the time points $t_1$ $t_2$, the values of H and L ①, ② of the terminal $P_1$ at each time point are obtained and stored. If the power supply has changed to the ON state at the time point $t_3$, a discrimination value (I for H and L at the time point $t_3$ is obtained, and a shift average value ④ resulting from adding these ①, ②, ③ and dividing the addition result by 3 is calculated and the calculated value is converted into an A/D converted value (ST122). After the time point $t_4$, the battery connection state is continuously monitored by A/D converted values of the terminal $P_1$.

As shown above, in this monitoring function, whereas signal voltages corresponding to the number of connections are used for the monitoring of the battery connection state with the AC power supply ON, the signals of H and L in correspondence to the presence or absence of the connection are monitored when the power supply is OFF. Therefore, power consumption can be saved low when the power supply is in the OFF state, so that the backup batteries can be prolonged in service life. Thus, appropriate management on the connection state, the continuing time and the like can be achieved.

What is claimed is:

1. An apparatus for determining life of a battery which supplies charged electricity to an electrical appliance, comprising:
    life storing means for storing a relationship between standard total values of discharge voltages and standard life values;
    discharge voltage drop amount totaling means for totaling the discharge voltage drop amounts since the start of the compulsory discharge of the charged battery; and
    life determination means for determining the life of the battery from a total value of totaled discharge voltage drop amounts with reference to the relationship stored in the life storing means.

2. The battery life determination apparatus according to claim 1, further comprising: means for executing a plurality of times of initial discharge of the battery; correction factor calculating means for calculating a correction factor for correcting the relationship between standard total values and standard life values according to discharge characteristics obtained by the initial discharge; and correction means for correcting the relationship between the standard total values and the standard life values by the correction factor, wherein the battery life is determined by applying the measured total value to the corrected relationship.

3. The battery life determination apparatus according to claim 1, further comprising: temperature change detecting means for detecting that a temperature change of more than a specified value has occurred; and means for starting life determination after a specified time elapse when a temperature change of more than a specified value has occurred at a start of the life determination.

4. The battery life determination apparatus according to claim 1, further comprising: period counting means for counting a period since a start of use of the battery; a first timer which expires in steps of a specified first cycle; a second timer which expires in steps of a second cycle shorter than the first cycle; and means for activating the life determination means in steps of the first until the period counting means counts a specified period and activates the life determination means in steps of the second cycle after the period counting means has counted the specified period.

5. The battery life determination apparatus according to claim 1, further comprising: cell failure detecting means for detecting a cell failure of the battery from discharge voltage drop characteristic; and means for correcting a discharge voltage drop amount upon detection of a cell failure, wherein the life determination is executed with a corrected measured discharge voltage drop amount upon detection of the cell failure.

6. An apparatus for determining life of a battery which supplies charged electricity to an electrical appliance, comprising:
    life storing means for storing a relationship between standard total values of discharge voltage drop amounts since a start of discharge of the battery and standard life values;
    discharge voltage drop amount totaling means for totaling the discharge voltage drop amounts since the start of discharge with the battery being discharged;
    life determination means for determining the life of the battery from a measured total value of totaled discharge voltage drop means with reference to the relationship stored in the life storing means;
    means for inputting charge history;
    means for inputting elapsed time; and
    fuzzy interference means for receiving a life value obtained in correspondence to the total value, the charge history and the elapsed time, executing a fuzzy operation and outputting a life value of the battery.

7. A method for determining life of a battery, comprising:
    storing, in a storage device, a relationship between standard total values of discharge voltage drop amounts since a start of discharge of the battery and standard life values;
    measuring discharge voltage drop amounts with a time elapse since the start of discharge with the battery being discharged; and
    determining the life of the battery from a measured total value of discharge voltage drop amounts during a specified time elapse and the relationship between standard total values and with reference to the relationship stored in the life storing means.

8. The battery life determination method according to claim 7, further comprising steps of: executing a plurality of times of initial discharge of the battery; calculating a correction factor from discharge characteristics obtained from the plurality of times of initial discharge, as well as standard discharge characteristics; correcting the relationship between standard total values and standard life values stored in the storage means by using the correction factor; and determining the life of the battery by applying the measured total value to the corrected relationship.

9. The battery life determination method according to claim 7, wherein temperature is detected at a start of life determination, where if a temperature change of more than a specified value has occurred, the life determination is executed after a specified time elapse.

10. The battery life determination method according to claim 7, wherein the life determination is executed in steps of a first cycle until a specified time period elapses since a start of use of the battery, and the life determination is executed in steps of a second cycle shorter than the first cycle after the specified time period has elapsed.

11. An electrical appliance which is equipped with a lead-acid battery and which is supplied with a power supply voltage from this lead-acid battery to its circuitry, the electrical appliance comprising: discharge characteristic measuring means for measuring discharge characteristic of the battery; cell failure deciding means for deciding presence or absence of a cell failure from the discharge characteristic; and means for lowering a discharge termination voltage of the battery by a specified value when presence of a cell failure is decided.

* * * * *